(12) United States Patent
    Miwa

(10) Patent No.: US 10,271,432 B2
(45) Date of Patent: Apr. 23, 2019

(54) ENCAPSULATED CIRCUIT MODULE, AND PRODUCTION METHOD THEREFOR

(71) Applicant: MEIKO ELECTRONICS CO., LTD., Ayase-shi, Kanagawa (JP)

(72) Inventor: Satoru Miwa, Nagoya (JP)

(73) Assignee: MEEKO ELECTRONICS CO., LTD., Ayase-shi, Kanagawa (JP)

( * ) Notice: Subject to any disclaimer, the term of this patent is extended or adjusted under 35 U.S.C. 154(b) by 0 days.

(21) Appl. No.: 15/534,401

(22) PCT Filed: Jul. 10, 2015

(86) PCT No.: PCT/JP2015/069938
    § 371 (c)(1),
    (2) Date: Jun. 8, 2017

(87) PCT Pub. No.: WO2016/092893
    PCT Pub. Date: Jun. 16, 2016

(65) Prior Publication Data
    US 2017/0354039 A1    Dec. 7, 2017

(30) Foreign Application Priority Data

Dec. 12, 2014 (WO) .............. 2014/082958

(51) Int. Cl.
    *H05K 1/02*    (2006.01)
    *H05K 1/18*    (2006.01)
    (Continued)

(52) U.S. Cl.
    CPC ............. *H05K 1/185* (2013.01); *H01L 21/56* (2013.01); *H01L 21/561* (2013.01);
    (Continued)

(58) Field of Classification Search
    CPC ....... H05K 1/185; H01L 21/56; H01L 21/561; H01L 23/3121; H01L 23/552; H01L 24/97
    (Continued)

(56) References Cited

U.S. PATENT DOCUMENTS

2006/0221591 A1    10/2006  Kong

FOREIGN PATENT DOCUMENTS

| JP | 06275741 A | 9/1994 |
| JP | 08037253 A | 2/1996 |
| JP | 2002185338 A | 6/2002 |
| JP | 2004172304 A | 6/2004 |
| JP | 2007157891 A | 6/2007 |

(Continued)

OTHER PUBLICATIONS

Tsukamoto et al. (Machine Translation of Japanese Patent Publication No. 2012-019091), Jan. 26, 2012.*
PCT Notification of Transmittal of Translation of the International Preliminary Report on Patentability (Chapter II) dated Jun. 15, 2017 in International Application No. PCT/JP2015/069938.
International Search Report and Written Opinion dated Feb. 3, 2015 in PCT Application No. PCT/JP2014/082958.

(Continued)

*Primary Examiner* — Tremesha S Willis
(74) *Attorney, Agent, or Firm* — Plumsea Law Group, LLC

(57) ABSTRACT

To reduce, when a single encapsulated circuit module has electronic components that are mutually influenced by their electromagnetic waves, the mutual influence, an embodiment provides an encapsulated circuit module M having a substrate 100 on which a number of electronic components 200 are mounted. An electronic component 200A is a high frequency oscillator. A metal side wall 320 of a partition member is provided on the substrate 100. One surface of the (Continued)

substrate 100 is entirely covered with a first resin 400 together with the electronic components 200 and the side wall 320. The first resin 400 is covered with a metal shield layer 600 for shielding electromagnetic waves. The electronic component 200A is surrounded by the side wall 320 and the shield layer 600.

10 Claims, 21 Drawing Sheets

(51) Int. Cl.
  *H01L 21/56*   (2006.01)
  *H01L 23/00*   (2006.01)
  *H05K 3/22*   (2006.01)
  *H01L 23/31*   (2006.01)
  *H01L 23/552*   (2006.01)
  *H05K 9/00*   (2006.01)

(52) U.S. Cl.
  CPC ........ *H01L 23/3121* (2013.01); *H01L 23/552* (2013.01); *H01L 24/97* (2013.01); *H05K 1/0218* (2013.01); *H05K 1/0243* (2013.01); *H05K 3/22* (2013.01); *H05K 9/0022* (2013.01); *H01L 2924/1815* (2013.01); *H01L 2924/3025* (2013.01); *H05K 2201/10075* (2013.01)

(58) Field of Classification Search
  USPC ........................................................ 361/748
  See application file for complete search history.

(56) References Cited

FOREIGN PATENT DOCUMENTS

| | | |
|---|---|---|
| JP | 2007294965 A | 11/2007 |
| JP | 2008084964 A | 4/2008 |
| JP | 2011258887 A | 12/2011 |
| JP | 2012019091 A | 1/2012 |
| JP | 2013222829 A | 10/2013 |
| WO | 2007083352 A1 | 7/2007 |

OTHER PUBLICATIONS

International Search Report and Written Opinion dated Oct. 13, 2015 in PCT Application No. PCT/JP2014/069938.

Office Action dated Mar. 7, 2017 in Japanese Patent Application No. 2016-563205, and English translation thereof.

* cited by examiner

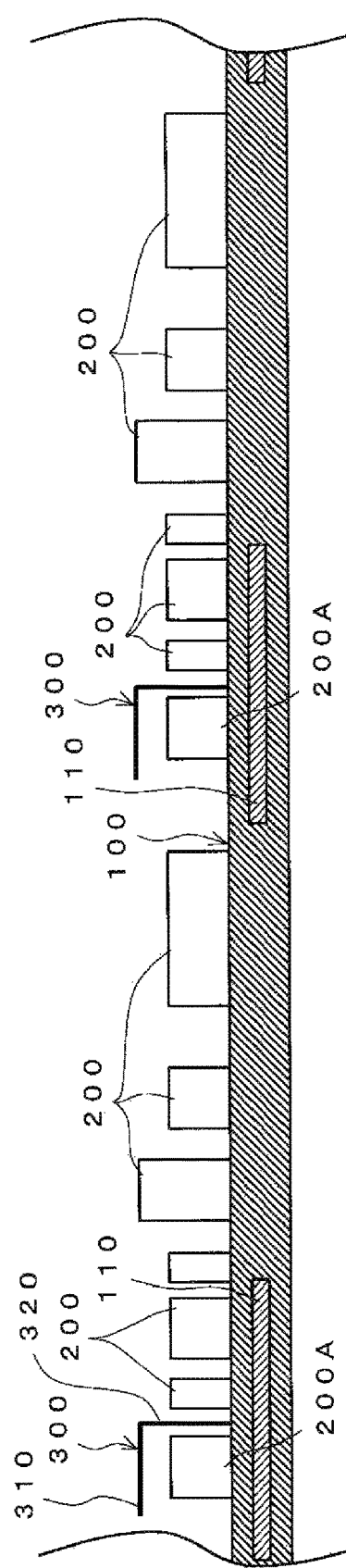

US 10,271,432 B2

ENCAPSULATED CIRCUIT MODULE, AND PRODUCTION METHOD THEREFOR

This application is a national stage application of International Patent Application No. PCT/JP 2015/069938, filed Jul. 10, 2015 (WO 2016/092893A 1, published Jun. 16, 2016), which claims the priority of International Application No. PCT/JP 2014/082958, filed Dec. 12, 2014, both of which are herein incorporated by reference in their entirety

TECHNICAL FIELD

The present invention relates to encapsulated circuit modules.

BACKGROUND ART

Encapsulated circuit modules are known.

Encapsulated circuit modules include a substrate having wiring (such as a printed wiring board), electronic components mounted so as to be electrically connected with the wiring of the substrate, and a resin covering the substrate together with the electronic components. By covering the electronic components with the resin, encapsulated circuit modules can provide protection for electronic components and protection of electrical contacts between the electronic components and the wiring of the substrate.

Encapsulated circuit modules include electronic components as described above. Some electronic components are vulnerable to electromagnetic waves. Other electronic components emit electromagnetic waves.

In many situations where an encapsulated circuit module is actually used, the encapsulated circuit module is combined with other electronic components. Such other electronic components may be included in another encapsulated circuit module or not. Moreover, some other electronic components are vulnerable to electromagnetic waves and others emit electromagnetic waves.

When the encapsulated circuit module is actually used, it may be desired in some cases to reduce the influence of the electromagnetic waves emitted by other electronic components outside the encapsulated circuit module on the electronic components included in the encapsulated circuit module. It may also be desired in other cases to reduce the influence of the electromagnetic waves emitted by the electronic component(s) included in the encapsulated circuit module on other electronic component(s) outside the encapsulated circuit module.

From such a viewpoint, for circuit modules without having been subjected to encapsulation with a resin, a technique of surrounding the entire circuit module with a metal shield against electromagnetic waves is practically used.

An exemplified metal shield is a box formed of a thin metal plate, with one side open. When using a box, the circuit module is not usually encapsulated with a resin. The box is attached to the substrate with the edge defining the opening of the box being in contact with the substrate to enclose the electronic components and thereby to shield the electronic components.

Another technique has been suggested for encapsulated circuit modules in which a metal shield layer is formed on the surface of the resin used for encapsulation by applying a paste containing metal powder to the surface of the resin or plating such surface with a metal using a dry or wet process. The process of applying a paste and a sputtering process, which is a kind of a dry metal-plating, have been practically used.

Techniques using a box as described above or techniques of forming a shield layer by applying a paste containing metal powder to or metal-plating a surface of a resin is for preventing the electronic components located inside and outside of the encapsulated circuit module from affecting each other by electromagnetic waves.

In some cases, however, a single encapsulated circuit module has electronic components that mutually affect by electromagnetic waves. For example, if an encapsulated circuit module has two or more electronic components and one of them is a high frequency oscillator, strong electromagnetic waves are emitted by the electronic component which is a high frequency oscillator. In such a case, if another electronic component in the encapsulated circuit module around the electronic component which is a high frequency oscillator is the component of which normal function is badly affected by strong electromagnetic waves, it is necessary to protect that other electronic component from the electromagnetic waves emitted by the electronic component which is a high frequency oscillator. The techniques using a box as described above or techniques of forming a shield layer by applying a paste containing metal powder to or metal-plating a surface of a resin are merely directed to form a wall to shield electromagnetic waves outside the circuit module or the encapsulated circuit module. If a single encapsulated circuit module has electronic components that mutually affect by electromagnetic waves, the wall does not function to reduce such mutual influence.

When a single encapsulated circuit module has electronic components that mutually affect by electromagnetic waves, as a technique to reduce such mutual influence by the electromagnetic waves, techniques of providing a partition member made of a metal capable of shielding electromagnetic waves in the encapsulated circuit module have been used. The partition member has a wall extending upward from the substrate and, in some cases, a roof connected to the wall. Side edges of the wall (the term "side edges" as used herein refers to both ends of the wall in the direction parallel to the substrate) are typically in contact with the side surface of the resin covering the electronic components of the encapsulated circuit module and the upper end or the roof of the wall is typically in contact with the surface of the resin covering the electronic components of the encapsulated circuit module.

SUMMARY OF INVENTION

Technical Problem

The encapsulated circuit module having the partition member as described above is useful in that it is possible to reduce the mutual influence by electromagnetic waves if one encapsulated circuit module has electronic components mutually affecting by electromagnetic waves.

Even such encapsulated circuit modules, however, have room for improvement.

In encapsulated circuit modules in which the upper end of the wall of the partition member is in contact with the upper surface of the resin covering the electronic component, the resin could possibly be separated from the wall between the resin and the upper end of the wall of the partition member due to the difference in expansion coefficient between the resin and the partition member in the encapsulated circuit module manufactured. When the encapsulated circuit module is used, the electronic circuits contained therein produce heat, so that the possibility of the separation of the resin from the wall is not so small as to be negligible.

When the resin separated from the wall of the partition member, so-called package cracking occurs. This could possibly result in disconnection of the circuit due to cracking of the package starting from that, or malfunction of the circuit due to moisture absorption or the like.

An object of the present invention is to provide a technique with which, in an encapsulated circuit module having a partition member, separation of a resin from the wall of the partition member can be prevented.

Solution to Problem

In order to solve the aforementioned problem, the present inventor suggests the following inventions.

The present invention is an encapsulated circuit module including: a substrate having a ground electrode; at least two electronic components mounted on a surface of the substrate, at least one of the electronic components being a certain electronic component that should be shielded from electromagnetic waves from the other electronic component(s); a first resin layer comprising a first resin, the first resin layer covering the surface of the substrate together with the electronic components; a shield layer formed by covering a surface (upper surface) of the first resin layer, a side surface of the first resin layer, and a side surface of the substrate, the shield layer being electrically connected with the ground electrode; and a partition member having a wall positioned between the certain electronic component and the remaining electronic component(s), the partition member being capable of shielding electromagnetic waves.

The partition member has a wall that extends from the substrate and does not reach the surface of the first resin layer, a distance existing between an upper end of the wall and the surface of the first resin layer.

The encapsulated circuit module is covered with the first resin on one surface of the substrate together with the electronic component(s). The first resin corresponds to a resin in the related art.

The encapsulated circuit module has the shield layer. The shield layer is similar to shield layers in the related art and made of a metal that cuts off electromagnetic waves. This shield layer makes it possible to reduce the influence of the electromagnetic waves emitted by the electronic component(s) outside the encapsulated circuit module on the electronic component(s) within the encapsulated circuit module, and the influence of the electromagnetic waves emitted by the electronic component(s) within the encapsulated circuit module on the electronic component(s) outside the encapsulated circuit module.

In this encapsulated circuit module, at least one of the electronic components is a certain electronic component that should be shielded from electromagnetic waves from the other electronic component(s). The certain electronic component is either an electronic component that emits strong electromagnetic waves (e.g., when the certain electronic component is an oscillator, it emits strong electromagnetic waves) and therefore other electronic component(s) is likely to be affected by the electromagnetic waves emitted by the certain electronic component, or an electronic component that is vulnerable to electromagnetic waves emitted by another electronic component. The encapsulated circuit module according to the present application has, in the first resin layer, a partition member having a wall capable of shielding electromagnetic waves between such certain electronic component and the other electronic component(s). This makes it possible to shield electromagnetic waves between the certain electronic component and the other electronic component(s). It is thus possible to reduce mutual influence of electromagnetic waves if a single encapsulated circuit module has electronic components that emit electromagnetic waves affecting their surroundings.

The partition member has the wall that extends from the substrate and does not reach the surface of the first resin layer, and a distance exists between the upper end of the wall and the surface of the first resin layer. The distance contributes to preventing the first resin layer of the encapsulated circuit module manufactured from being separated from the partition member due to a difference in thermal expansion coefficient of the partition member and the first resin layer. More specifically, the first resin layer that is present between the upper end of the wall of the partition member and the surface of the first resin layer cancels the difference in expansion between the first resin layer and the wall of the partition member due to the difference in thermal expansion coefficient between the first resin layer and the partition member.

Accordingly, in this encapsulated circuit module, it is possible to prevent the first resin layer from being separated from the wall of the partition member when the encapsulated circuit module is used.

The partition member of the present application has a wall as described above. The partition member can have any shape and size as long as a distance exists between the upper end of the wall and the surface of the first resin layer.

For example, the distance between the upper end of the wall and the surface of the first resin layer can be 120 µm or smaller. A larger distance than that between the upper end of the wall and the surface of the first resin layer merely increases the first resin layer covering the substrate and has no meaning. A distance of larger than 120 µm between the upper end of the wall and the surface of the first resin layer could possibly deteriorate a shielding effect of the wall of the partition member against electromagnetic waves. The distance up to 120 µm is enough to provide an effect of preventing the first resin layer from being separated from the wall of the partition member. A distance of 80 µm between the upper end of the wall and the surface of the first resin layer is sufficient to provide this effect, so that it is preferable that the distance between upper end of the wall and the surface of the first resin layer is between 80 µm and 120 µm.

The upper surface of the wall and the surface of the first resin layer may be parallel to each other. In this case, for similar reasons to those described above, it is preferable that a distance between the upper surface of the wall and the surface of the first resin layer is 120 µm or smaller. It is more preferable that the distance is between 80 µm and 120 µm, for similar reasons to those described above.

The partition member may have a roof connected with the upper end of the wall, the roof being substantially parallel to the substrate and a distance may exist between the roof and the surface of the first resin layer. When the partition member has a roof, an effect of shielding electromagnetic waves can be obtained also in the direction perpendicular to the substrate. The reason why it is preferable that the roof of the partition member is away from the surface of the first resin layer is similar to the reason why the upper surface of the wall should be away from the surface of the first resin layer. The distance is preferably 120 82 m or smaller, and more preferably, between 80 µm and 120 µm for similar reasons to those described in terms of the distance between the upper surface of the wall and the surface of the first resin layer. It is possible that the roof and the surface of the first resin layer are parallel to each other. In such a case, the distance between them is preferably 120 μm or smaller and more preferably, between 80 μm and 120 μm.

A distance may exist between the side edge of the wall and the side surface of the first resin layer. The side edge of the wall can also be in contact with the side surface of the first resin layer. The latter case, however, can cause separation of the first resin layer from the wall of the partition member due to the difference in expansion coefficient between the first resin and the partition member at a side surface of the first resin layer. If such a situation occurs, in addition to the aforementioned disadvantage caused by so-called package cracking, in a case where the wall of the partition member is soldered to the substrate, the soldered portion can be exposed. As a result, a leakage of the solder could possibly occur in mounting the encapsulated circuit module to another substrate to use the encapsulated circuit module. The distance between the side edge of the wall and the side surface of the first resin layer can contribute to suppressing occurrence of such a disadvantage. The distance between the side edge of the wall and the side surface of the first resin layer is preferably 120 μm or smaller, and more preferably, between 80 μm and 120 μm for similar reasons to those described in terms of the distance between the upper surface of the wall and the surface of the first resin layer. The side edge of the wall can be parallel to the side surface of the first resin layer. The distance between the side edge of the wall and the side surface of the first resin layer is preferably 120 μm or smaller, and more preferably, between 80 μm and 120 μm as in the aforementioned cases. When the wall is parallel to the side surface of the first resin layer, the distance between the wall and the side surface of the first resin layer is preferably 120 μm or smaller, and more preferably, between 80 μm and 120 μm.

As described above, the partition member is intended to shield electromagnetic waves. In general, the partition member is made of, for example, a plate of a metal that can achieved this. If the partition member is intended to shield electromagnetic waves, the partition member should be grounded during the use of the encapsulated circuit module. The partition member may be electrically connected with the ground electrode of the substrate, for example. Since the ground electrode is normally grounded during the use of the encapsulated circuit module, the electrical connection between it and the partition member results in grounding of the partition member during the use of the encapsulated circuit module.

The partition member may be electrically connected with the ground electrode by being in direct contact with the ground electrode or may be indirectly electrically connected with the ground electrode via another member that is electrically connected with the ground electrode. For example, the partition member may be electrically connected with the ground electrode by directly contacting the ground electrode and the lower end of the wall.

Furthermore, the wall of the partition member may have a hole for strengthening a connection between the wall and the first resin layer present on both sides of the wall. The first resin layer is formed by pouring the first resin before being cured and curing the first resin. By providing a hole in the wall of the partition member to allow the first resin before being cured to flow into the inside (i.e., the side closer to the certain electronic component) of the partition member, it is possible to strengthen the mutual connection between the partition member and the first resin layer after the first resin is cured as the first resin layer.

One of the electronic components included in the encapsulated circuit module of the present invention may be a communication device that performs wireless communication. The communication device may be either one of a transmitter and a receiver, or both.

When one of the electronic components is a communication device, the shield layer of the encapsulated circuit module of the present invention may have an opening formed therein. The opening is formed in a predetermined portion of the shield layer covering the surface of the first resin layer, more specifically, at a suitable position so that the communication device can perform wireless communication via the opening, with a size appropriate for achieving this.

The opening may be is provided in a predetermined range including a position corresponding to a part of the communication device in a plan view of the substrate, in a portion of the shield layer that covers the surface of the first resin layer. This makes it possible to reduce the size of the opening required for the communication device to perform wireless communication. This means that a range in which the function of shielding electromagnetic waves that the shield layer should normally perform is impaired can be reduced.

In this case, the opening is not necessarily formed at a position corresponding to the entire communication device in a plan view of the substrate. Instead, a portion of the opening can be present at a position where no communication device is present in a plan view of the substrate (that is, the opening may be outside the position where the communication device is present).

The shield layer (or the first and second metal covering layers thereof described later) is formed by applying a paste containing metal powder or by metal-plating. The metal-plating may be either wet plating or dry plating. Examples of the wet plating include electrolytic plating and electroless plating. Examples of the dry plating include physical vapor deposition (PVD) and chemical vapor deposition (CVD). Examples of the former include sputtering and vacuum vapor deposition and examples of the latter include thermal CVD and photo CVD. Of these, wet plating is the most advantageous in consideration of costs. Besides, the residual stress in the metal coating layer (shield layer) formed by wet plating is lower than the residual stress in shield layers made by another method, so the wet plating is suitable for application to the present invention. Furthermore, the thickness of the shield layer obtained by PVD or CVD, which is a technique of thin film formation, ranges from the order of nanometers to several micrometers whereas the wet plating can provide a thicker film ranging from several micrometers to several tens micrometers. Considering the shielding effect against electromagnetic waves, it is preferable that the shield layer has a thickness of at least several micrometers so that the wet plating is compatible with the present invention in that respect as well. Although wet plating includes electrolytic plating and electroless plating, it is preferable to use electroless plating that does not require any flow of electrical current through surfaces of the encapsulated circuit modules to be processed rather than the electrolytic plating requiring a flow of electrical current, in consideration of possible damages of the electronic components in the encapsulated circuit modules.

The shield layer of the present invention is electrically connected with the ground electrode of the substrate. The shield layer may be either in direct contact with the ground electrode or in indirect contact with the ground electrode via another electrically conductive metal as long as it is electrically connected with the ground electrode. For example, the ground electrode may be embedded in the substrate at a predetermined depth. In such cases, the first resin and the substrate are removed at a predetermined width across the boundaries between the sections in the snicking step described later to the depth reaching the ground electrode in the substrate, which exposes the edge of the ground electrode on the periphery of each section. In this state, by applying a paste containing metal powder or performing metal-plating, the shield layer is directly in contact with the exposed edge of the ground electrode. Alternatively, the shield layer can be indirectly electrically connected with the ground electrode using an appropriate metal member.

The shield layer may be a single layer or it may have two or more layers. The metal constituting the respective layers may be the same, but can be different.

In the present invention, the shield layer can be formed as including a first metal layer and a second metal layer, the first metal layer including a first metal having an excellent shielding property against an electric field, and the second metal layer including a second metal having an excellent shielding property against a magnetic field.

If the shield layer has such two layers, it is possible to protect the electronic component(s) from electromagnetic waves more efficiently.

Copper or iron can be used as an example of the first metal.

Nickel can be used as an example of the second metal.

Either the first metal covering layer or the second metal covering layer may be exposed outside. In any case, the aforementioned functions are not affected. When, however, copper is used as the first metal, it is better not to expose the first metal covering layer comprising copper in consideration of the appearance, because copper can turn black as a result of oxidation.

The present inventor also provides the following method as a solution to the aforementioned problem. The following method is an example of a manufacturing method for obtaining the encapsulated circuit module as described above.

The manufacturing method is a method of manufacturing encapsulated circuit modules including: a step of preparing a substrate with a surface having a plurality of contiguous assumed sections, each of the sections having at least two electronic components mounted thereon, at least one of the electronic components being a certain electronic component that should be shielded from electromagnetic waves from the other electronic component(s); a step of placing a partition member having a wall positioned between the certain electronic component and the other electronic component(s) and shielding electromagnetic waves; a first covering step for entirely covering the surface of the substrate having a ground electrode with a first resin together with the electronic components and the partition member and curing the first resin; a snicking step for removing a predetermined width of the first resin and the substrate to a predetermined depth of the substrate, the predetermined width including a boundary between the adjacent assumed sections; a shield layer-forming step for forming a metal shield layer on the surface of the first resin and side surfaces of the first resin and the substrate exposed by the snicking step, by applying a paste containing metal powder or metal-plating, the shield layer being electrically connected with the ground electrode; and a snipping step for separating the sections by cutting the substrate along the boundaries between the sections to obtain a plurality of the encapsulated circuit modules corresponding to the sections.

In the method of manufacturing encapsulated circuit modules described above, a first resin shaping step may be performed after the first covering step and before the shield layer-forming step to scrape a portion of the surface of the cured first resin such that the surface of the cured first resin becomes parallel to the surface of the substrate without exposing the partition member on the surface of the first resin.

By forming the first resin layer such that the first resin layer is thicker than the height of the partition member embedded therein and scraping the first resin layer, it is possible to keep a distance between the upper surface of the wall of the partition member or the upper surface of the roof and the surface of the first resin layer, and to appropriately control the length of the distance. When the first resin is applied to the substrate, the thickness of the first resin layer present above the upper surface of the wall of the partition member or the upper surface of the roof can be controlled to some extent, but the accuracy of this control is not high. It is difficult to reduce the thickness of the first resin layer above the aforementioned positions to a thickness of smaller than 500 μm. In the first resin shaping step, the thickness of the first resin on the tallest electronic component is controlled by, for example, mechanical cutting, of which accuracy can generally be about ±100 μm. Accordingly, the length of the distance can appropriately be controlled. Specifically, the distance can be as described above. Specifically, the distance is preferably 120 μm or smaller, and more preferably, between 80 μm and 120 μm.

The partition member has a wall, and possibly with a wall and a roof. The preferable requirement for the distance between the wall of the partition member and the side surface of the encapsulated circuit module or between the roof and the upper surface of the encapsulated circuit module manufactured using this method of manufacturing encapsulated circuit modules is as described above. It is preferably performed to result in meeting the requirement in this encapsulated circuit module.

In the method of manufacturing encapsulated circuit modules according to the present application, a resin containing filler may be used as the first resin, but not limited thereto. In that case, this method of manufacturing encapsulated circuit modules includes a second covering step for covering the surface of the first resin covering the substrate with a second resin containing no filler and curing the second resin, and the shield layer-forming step may be for forming a shield layer on a surface of the second resin and side surfaces of the first resin and the substrate exposed by the snicking step, by applying a paste containing metal powder or metal-plating, the shield layer being electrically connected with the ground electrode.

The first resin in the present invention corresponds to the resin contained in the encapsulated circuit modules described in the related art. Fillers may be incorporated in the first resin. The filler is in the form of granules. In addition, since the filler is made of a material having a linear expansion coefficient that is different from that of the resin of the first resin and thereby serves to suppress the thermal expansion and contraction of the encapsulated circuit modules, it is often used for the encapsulated circuit modules at the present time.

On the other hand, when a shield layer is formed by applying a paste containing metal powder to the surface of the first resin in which filler is incorporated or plating such surface with a metal, the shield layer may fall off. The filler which is present on the surface of the first resin and is exposed from the first resin may be likely to fall off from the first resin. This falling of the filler from the first resin, if any, results in fall off of the shielding layer.

The second resin prevents such falling off of the shield layer. The second resin covers the surface of the first resin. The shield layer is formed on the surface of the second resin and the side surfaces of the first resin and the substrate exposed by the snicking step performed before the snipping for dicing. The second resin does not contain filler as described above. The shield layer thus formed does not have a problem of falling off which otherwise can occur due to the falling off of the filler. Even in this case, the portion of the shield layer that covers the side surface of the first resin covers the first resin without the interposed second resin. The present inventor has found, however, that the side surface of the first resin is roughened appropriately as a result of the snicking step performed in an ordinary method and that the shield layer adheres to the first resin well and is thus less likely to be separated.

When the wet plating is used for forming the shield layer, the shield layer is more likely to fall off due to falling off of the filler if no layer of the second resin is present. The present invention is also useful in that the wet plating can be selected in the process of forming the shield layer in manufacturing the encapsulated circuit modules.

When the first resin shaping step is performed, the filler present in the cured first resin may be more likely to fall off. However, by performing the second covering step thereafter to cover the surface of the first resin with the second resin, the falling off of the shield layer due to the falling off of the filler can be suppressed.

As described above, in the method of manufacturing encapsulated circuit modules according to the present application, the second resin allows suppression of the falling off of the shield layer from the first resin. When the second resin is used, however, since the shield layer is formed on the first resin with the second resin interposed therebetween, when the second resin falls off from the first resin, the shield layer falls off accordingly.

In order to prevent the second resin from falling off from the first resin, adhesion of the second resin to the first resin is important. This adhesion is achieved by an anchor effect, an intermolecular force, and some covalent bond between the first resin and the second resin.

In order to improve the adhesion of the second resin to the first resin, it is easy to use a same type of resin as that contained as a major resin component in the first resin as the second resin. In the present application, the term "major resin" means the resin of the first resin if a single resin constitutes the first resin and means a resin contained at the highest ratio if different kinds of resins constitute the first resin.

When the resin contained in the first resin as the major resin component is an epoxy resin, the second resin can be an epoxy resin. With this, the adhesion between the first resin and the second resin becomes large enough to be practical.

As described above, the second resin covers at least the portion of the first resin on one side which is covered with the shield layer. It is better that the thickness of the second resin is thin enough to such an extent that, for example, the falling off of the filler from the first resin can be prevented by covering the filler exposed on the first resin and the strength of the second resin can be maintained. The thinning of the layer of the second resin is advantageous in the case where the shield layer is formed by metal-plating because the roughening in the subsequent process is easy. For example, it is preferable that the layer of the second resin is thinned to such an extent that the uneven surface of the first resin is not flattened.

In the first covering step, entire covering of one surface of the substrate with the first resin containing filler together with the electronic components can be achieved using any method. For example, vacuum printing can be used for such a purpose.

By using vacuum printing, it is possible to prevent any fine voids from being incorporated into the cured first resin, and to cover electronic components having various shapes with the first resin without any gaps.

Although with this advantage, when vacuum printing is used in the first covering step, irregularities due to the difference in height of the electronic components will inevitably appear on a resin layer present on the components attached to the substrate if the layer is thin. In order to avoid this, when vacuum printing is used, it is necessary to give a margin to the thickness of the first resin on the electronic components, which results in a disadvantage that the completed encapsulated circuit modules become thick. The first resin shaping step can solve this. The first resin shaping step is well compatible with vacuum printing and can be considered as a technique that allows the vacuum printing to be used for the manufacture of the encapsulated circuit modules.

The first resin is required to have three properties, i.e., a penetrability (which is a property before being cured) to allow the first resin to enter between the electronic components, an adhesion to the electronic components as well as the substrate, and an anti-warping feature (which is a property after being cured).

In order to achieve these properties of the first resin, it is preferable that the first resin has the following characteristics. If the first resin has the following characteristics, the aforementioned requirements for the properties of the fist resin before and after curing are both met.

The characteristics that the first resin should have are that it contains the filler at an amount of 80% by weight or more relative to the total weight of the first resin containing the filler before being cured and has a linear expansion coefficient ($\alpha 1$) of 11 ppm/TMA or lower, a linear expansion coefficient ($\alpha 2$) of 25 ppm/TMA or lower, and a modulus of elasticity at 25° C. of 15 GPa/DMA or lower after being cured.

Of the characteristics required for the first resin, a high penetrability contributes to reducing the thickness of the completed encapsulated circuit modules. In general, a gap is present between the lower side of the electronic component and the substrate. The gap should be determined to have such a size that the first resin can be poured into the gap. A higher penetrability of the first resin makes it possible to reduce the gap between the lower side of the electronic component and the substrate. This in turn reduces the thickness of the encapsulated circuit module. With the resin having the aforementioned characteristics, the gap between the lower side of the electronic component and the substrate can be reduced to as small as 30 μm (in general, the gap is between 150 and 200 μm).

BRIEF DESCRIPTION OF DRAWINGS

FIG. 1(c) A side cross-sectional view showing a state in which a partition member is attached to the substrate shown in FIG. 1(b).

DESCRIPTION OF EMBODIMENTS

Hereinafter, a preferred embodiment of a method of manufacturing encapsulated circuit modules of the present invention will be described with reference to the drawings.

Figure 1A:
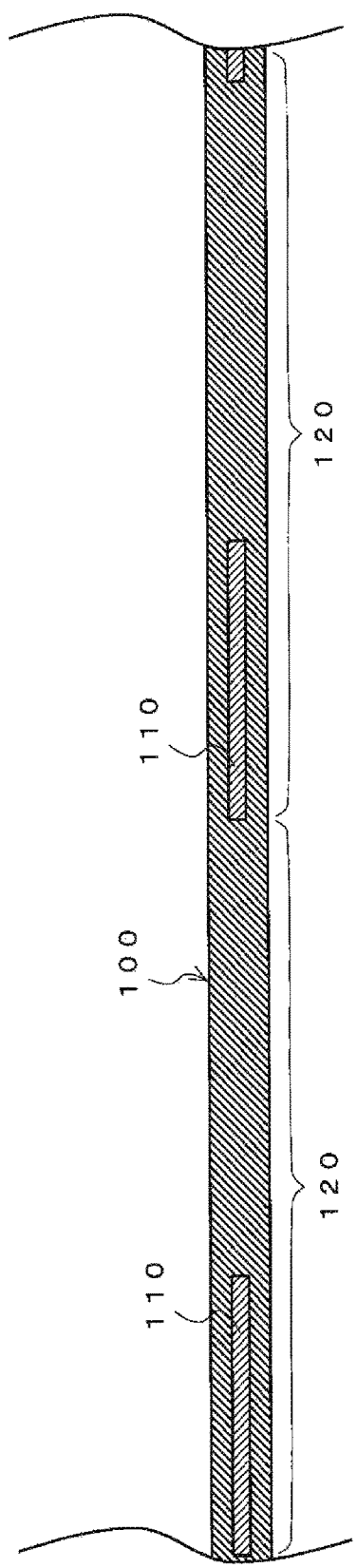
FIG. 1(a) A side cross-sectional view showing a configuration of a substrate used in a method of manufacturing encapsulated circuit modules according to an embodiment of the present invention.

In this embodiment, encapsulated circuit modules are manufactured using a substrate 100 shown in FIG. 1(a).

The substrate 100 may be an ordinary substrate, and the substrate 100 in this embodiment is also an ordinary one. The substrate 100 has wiring not shown. The wiring is electrically connected with electronic components described later, and supplies electricity to the electronic components. The wiring is known or widely known and is designed to provide the functions just mentioned. The wiring may be provided on the substrate 100 by any means, and may be provided anywhere on the substrate 100. For example, the wiring may be provided by printing on the surface of the substrate 100. In that case, the substrate 100 is generally referred to as a printed wiring board. The wiring may also be present inside the substrate 100.

When seen from the above, the shape of the substrate 100 is, for example, a rectangle. The shape of the substrate 100 is, however, usually determined as appropriate so as to reduce waste when a plurality of encapsulated circuit modules are formed as described later.

At appropriate positions of the substrate 100, ground electrode 110 is provided. In some cases, ground electrode 110 may be entirely or partially present in the substrate 100, or may be entirely or partially present on a surface of the substrate 100. In this embodiment, it is assumed that ground electrode 110 is embedded as a layer in the substrate 100 at an appropriate depth. The ground electrodes 110 are used to ground a shield layer described later when the final encapsulated circuit module is used. The ground electrodes 110 are designed to allow this.

In the method of manufacturing encapsulated circuit modules described in this embodiment, a large number of encapsulated circuit modules are manufactured from one substrate 100. That is, in this embodiment, multiple encapsulated circuit modules are obtained from a single substrate 100. The substrate 100 is divided into a large number of contiguous assumed sections 120, and each section 120 corresponds to a single encapsulated circuit module manufactured. The encapsulated circuit modules manufactured in association with the respective sections 120 are not necessarily identical, but are usually identical with each other. In the case where the encapsulated circuit modules manufactured in association with these sections 120 are identical with each other, each section 120 has the same size, and each section 120 is provided with wiring and a ground electrode 110 in the same pattern. In this embodiment, it is assumed that the encapsulated circuit modules of these sections 120 are identical with each other, but not limited thereto.

Figure 1B:
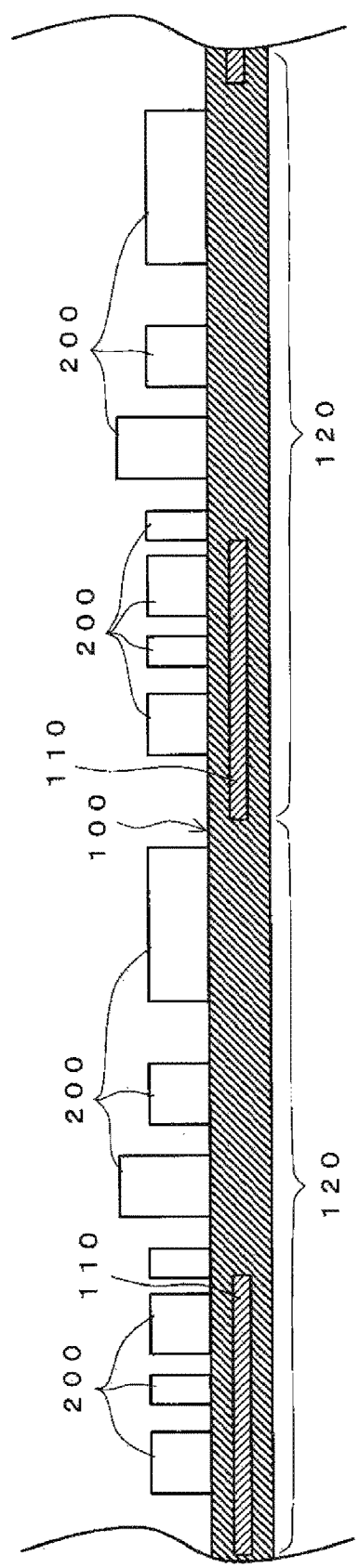
FIG. 1(b) A side cross-sectional view showing a state in which electronic components are mounted on the substrate shown in FIG. 1(a).

In order to manufacture the encapsulated circuit modules, first, as shown in FIG. 1(b), the electronic components 200 are attached to one surface (the upper surface in FIG. 1(b) in this embodiment) of the substrate 100. All of the electronic components 200 may be conventional ones and are selected as necessary from, for example, active devices such as integrated circuit (IC) amplifiers, oscillators, wave detectors, transceivers, etc., or passive devices such as resistors, capacitors, coils, etc.

The electronic components 200 are attached to the respective sections 120 with their terminals (not shown) electrically connected with the wirings of the respective sections 120. In this embodiment, since the identical encapsulated circuit modules are obtained in association with the respective sections 120, identical sets of the electronic components 200 are mounted on the respective sections 120. A known or widely-known technique may be used for attaching the electronic components 200 to each section 120, so a detailed description thereof will be omitted.

The gap between the lower side of the electronic component 200 and the substrate 100 may be smaller than usual, for example, on the order of 30 μm.

Next, a partition member 300 is attached to the substrate 100 (FIG. 1(c)). The partition member 300 is a member for forming a partition in the encapsulated circuit module. The partition member 300 is intended to reduce the influence of electromagnetic waves produced by the electronic component(s) 200 in the encapsulated circuit module on other electronic component(s) 200 in the same encapsulated circuit module. Note that the partition member 300 may be used as necessary when the following circumstances exist.

For example, in this embodiment, when an electronic component 200A shown in FIG. 1(c) is a high-frequency oscillator, a strong electromagnetic wave is emitted by the electronic component 200A. In such a case and in the case where the electronic components 200 around the electronic component 200A are vulnerable to noises due to strong electromagnetic waves, deteriorating their functions, it is necessary to protect them from the electromagnetic waves emitted by the electronic component 200A. Alternatively, it is conceivable that the electronic component 200A is particularly susceptible to electromagnetic waves emitted by other electronic component(s) 200. In such a case, the electronic component 200A should be protected from the electromagnetic waves emitted by other electronic component(s) 200. In any cases, it is preferable to shield electromagnetic waves between the electronic component 200A and other electronic component(s) 200. The partition makes this possible.

The partition member 300 has side walls 320 and a roof 310. The partition member 300 is made of, for example, a metal having conductivity so as to shield electromagnetic waves, and specifically, made of a metal plate. It is electrically connected with the ground electrode 110 directly or indirectly through another member in the encapsulated circuit module manufactured. Typically, the side walls 320 of the partition member are designed so that the partition achieved by the side walls 320 of the partition member alone or a combination of the partition achieved by the side walls 320 of the partition member 300 and the shield layer described later stretches around (one or more) certain electronic component(s) 200, when the substrate 100 is seen from the above.

Figure 2A:
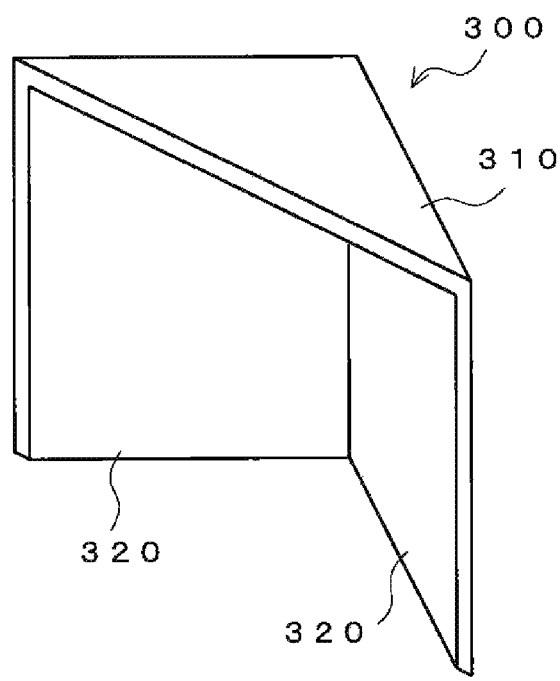
FIG. 2(a) A perspective view showing a configuration of a partition member used in a method of manufacturing encapsulated circuit modules of an embodiment.

Although not limited thereto, the side walls 320 of the partition member 300 in this embodiment have a shape as shown in FIG. 2(a). The partition member 300 comprise the roof 310 which is a triangle, more specifically a right triangle when viewed from the above, and the rectangular side walls 320 connected with the two sides other than the hypotenuse of the roof 310 with the sides of the side walls 320 adjacent to each other being connected with each other.

Attachment of the side walls 320 of the partition member to the substrate 100 may be performed in any manner. For example, the side walls 320 of the partition member can be attached to the substrate 100 by adhesion. If, for example, a lower end of each side wall 320 of the partition member is directly electrically connected with the ground electrode 110, the ground electrode 110 and the side walls 320 of the partition member can be designed for that purpose and the ground electrode 110 and the side wall 320 of the partition member can be adhered to each other using a known conductive adhesive or the like. For example, lower ends of the side walls 320 can be brought into contact with and electrically connected with the ground electrode 110 which is exposed from the surface of the substrate 100 from the beginning or which is exposed from the substrate 100 by scraping off the surface of the substrate 100.

The side walls 320 of the partition member are only required to be electrically connected with the ground electrode 110 at the end of the manufacture. In other words, the side walls 320 of the partition member may be in direct contact with the ground electrode 110, or in indirect contact with the ground electrode 110 via another conductive metal. Of course, if one of these is achieved, the other is not need to be achieved.

Figure 2B:
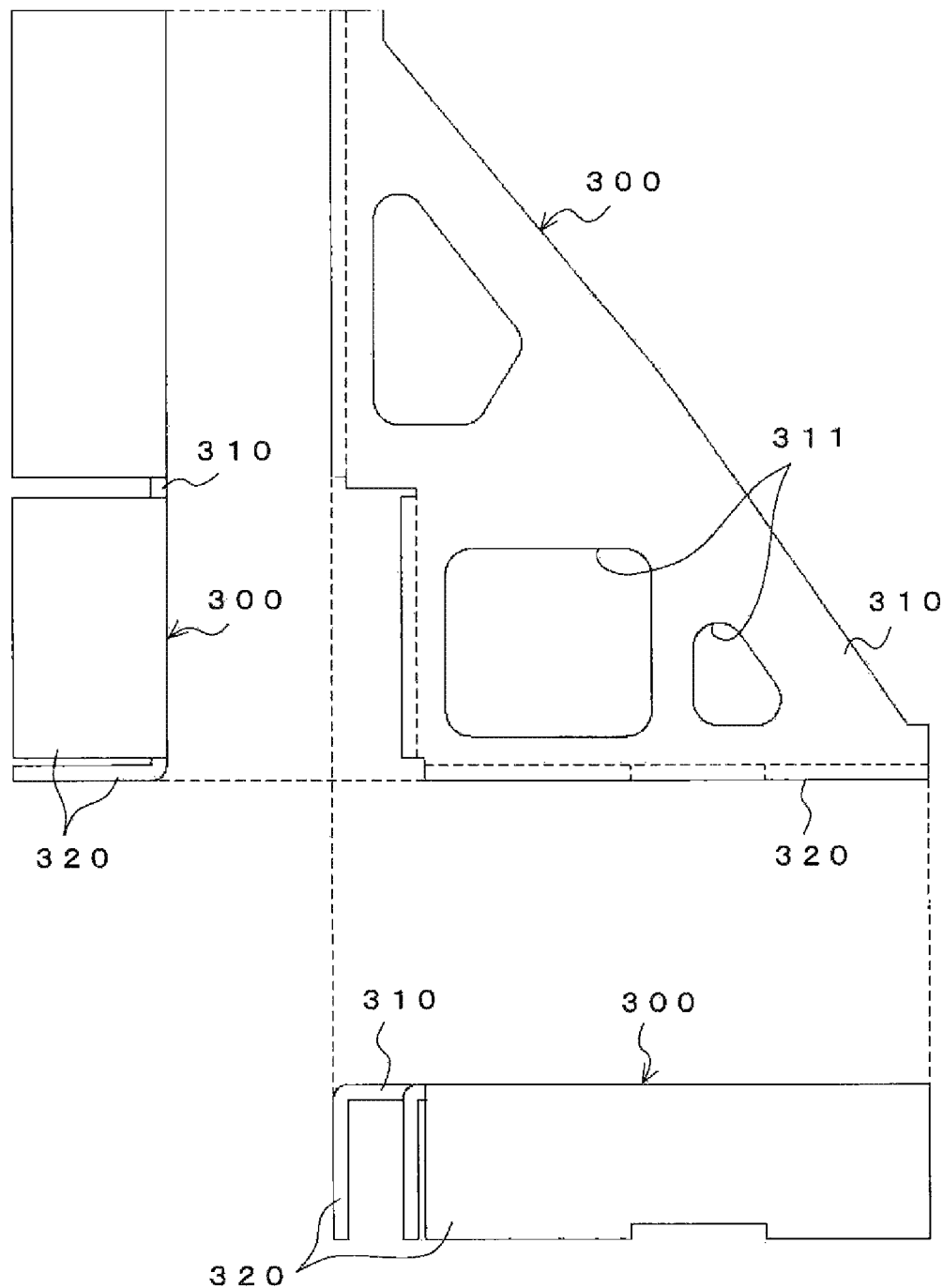
FIG. 2(b) A plan view, a left side view, and a front view showing a configuration of another partition member used in the method of manufacturing encapsulated circuit modules of the embodiment.
Figure 2C:
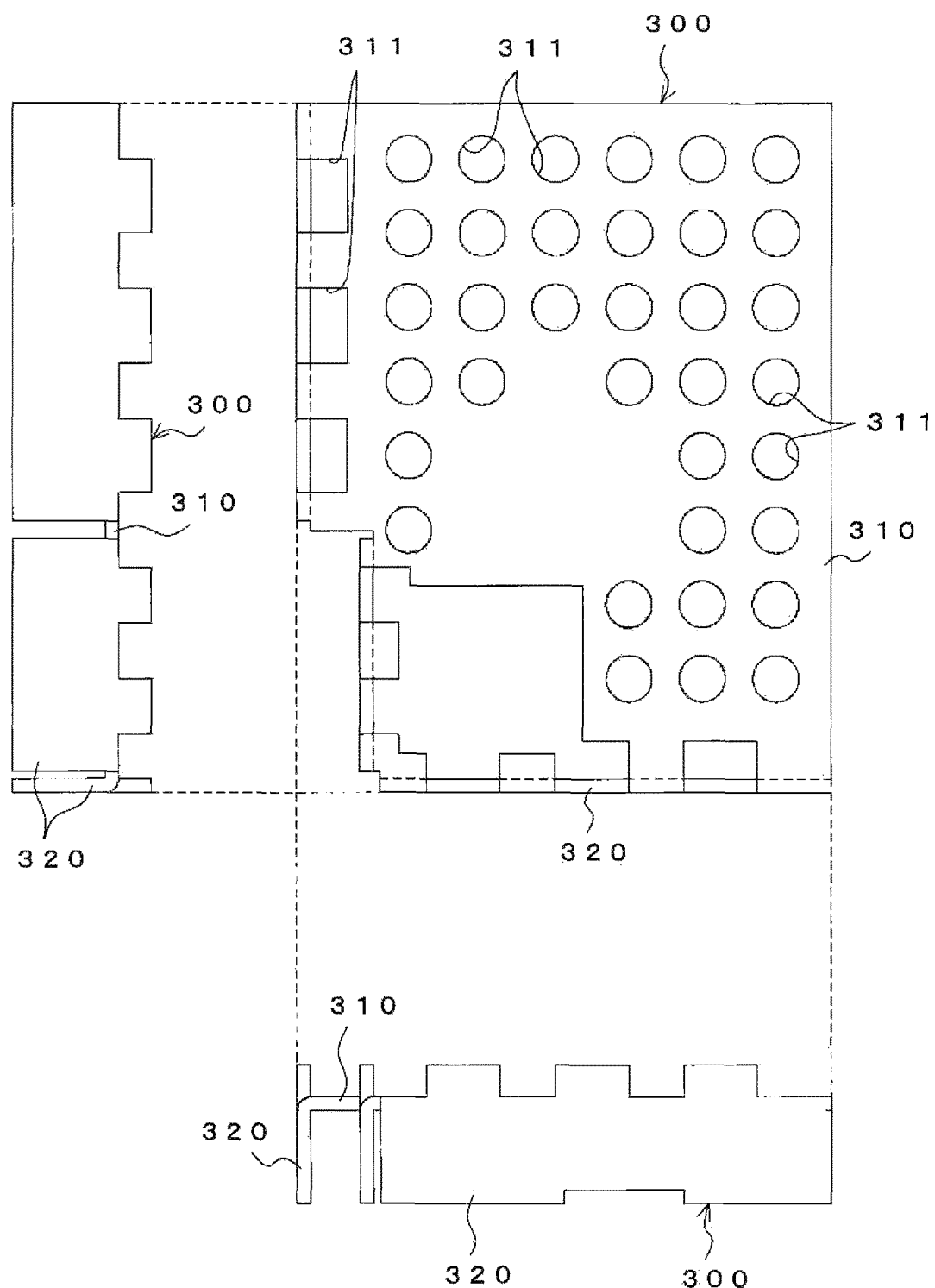
FIG. 2(c) A plan view, a left side view, and a front view showing a configuration of another partition member used in the method of manufacturing encapsulated circuit modules of the embodiment.
Figure 2D:
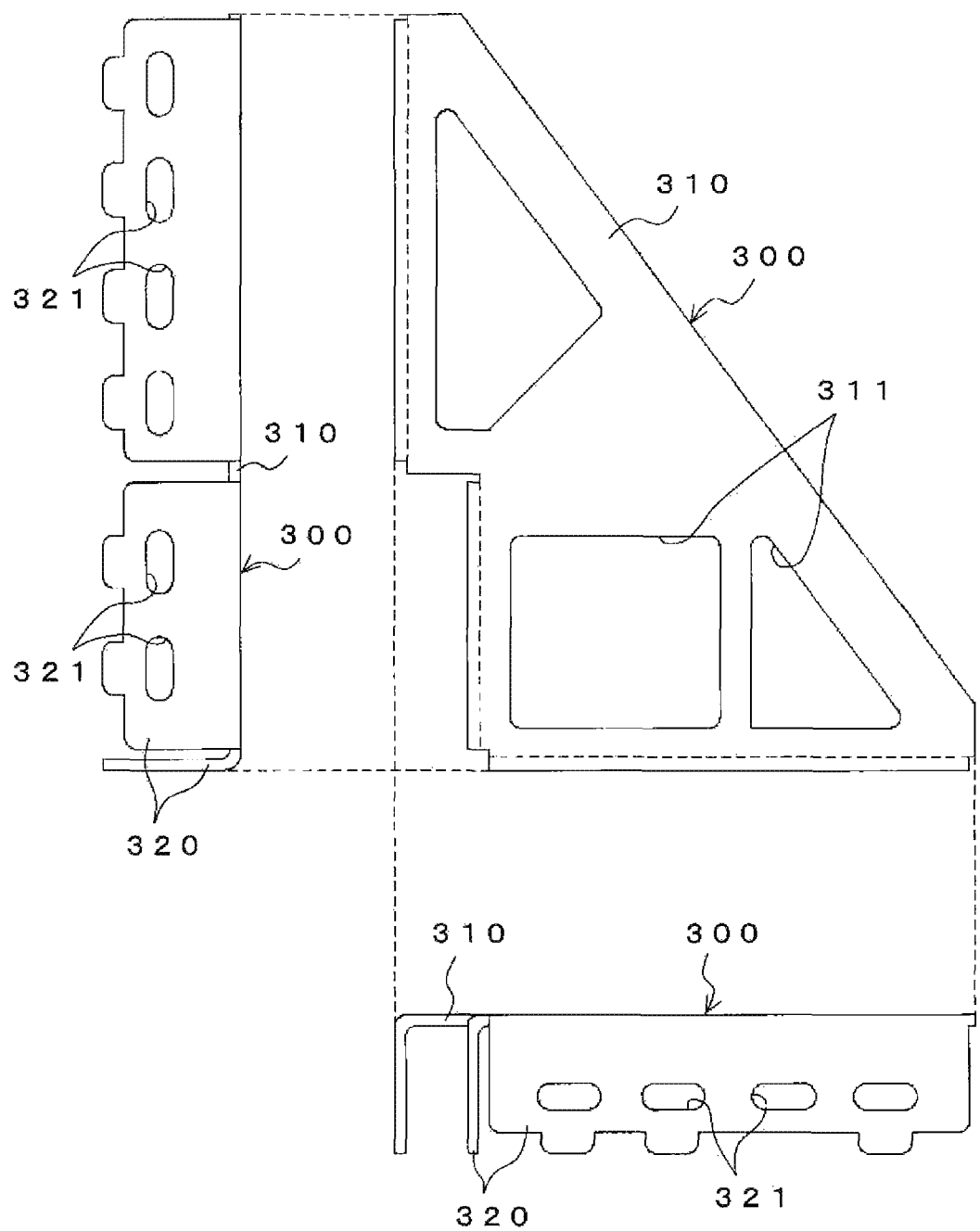
FIG. 2(d) A plan view, a left side view, and a front view showing a configuration of another partition member used in the method of manufacturing encapsulated circuit modules of the embodiment.

Other examples of the partition member 300 are shown in FIGS. 2(b), 2(c), and 2(d). In each of FIGS. 2(b), 2(c), and 2(d), illustrated are a plan view of the side walls 320 of the partition member, a left side view thereof on the left, and a front view thereof on the bottom. The partition member 300 shown in the figures has a roof 310, and the side walls 320. The roof 310 of the partition member 300 of the partition member shown in FIGS. 2(b), 2(c), and 2(d) has a plurality of roof holes 311 formed through the roof. The roof holes 311 are for allowing a first resin 400 to flow into the inward of the side walls 320 of the partition member 300 when the first resin 400 is poured, and serve to prevent separation between the side walls 320 of the partition member and the first resin 400 after the resin has been cured. Furthermore, the side wall 320 of the partition member shown in FIG. 2(d) has a plurality of side wall holes 321 formed through the side wall. The side wall holes 321 serve to prevent separation between the side walls 320 of the partition member and the first resin 400 after the resin has been cured.

In this embodiment, the side walls 320 of the partition member 300 attached to the substrate 100 is perpendicular to the substrate 100 and the roof 310 is parallel to the substrate.

Figure 1D:
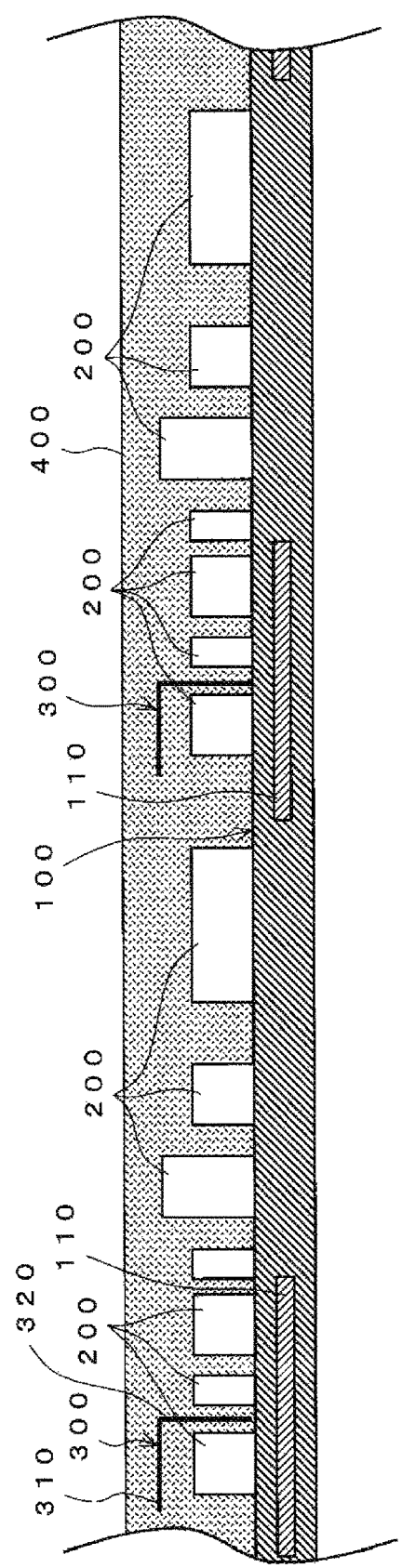
FIG. 1(d) A side cross-sectional view showing a state in which the substrate shown in FIG. 1(c) is covered with a first resin together with the components and the first resin is cured.

Next, the electronic components 200 and, if necessary, the partition member(s) 300 are attached to one surface of the substrate 100, and this surface is covered entirely with the first resin 400 together with the electronic components 200 and the partition member(s) 300. The first resin 400 is then cured (FIG. 1(d)).

To cover the entire surface of one surface of the substrate 100 with the first resin 400, although a resin encapsulation method such as molding and potting can be used, vacuum printing is used in this embodiment. With vacuum printing, it is possible to prevent any small voids from being incorporated into the first resin 400 used for encapsulation, and thus a process of removing voids from the resin can be omitted.

Vacuum printing can be performed using a known vacuum printer. An example of a known vacuum printer is a vacuum printing encapsulation system VE500 (trade mark) manufactured and sold by Toray Engineering Co., Ltd.

Figure 3:
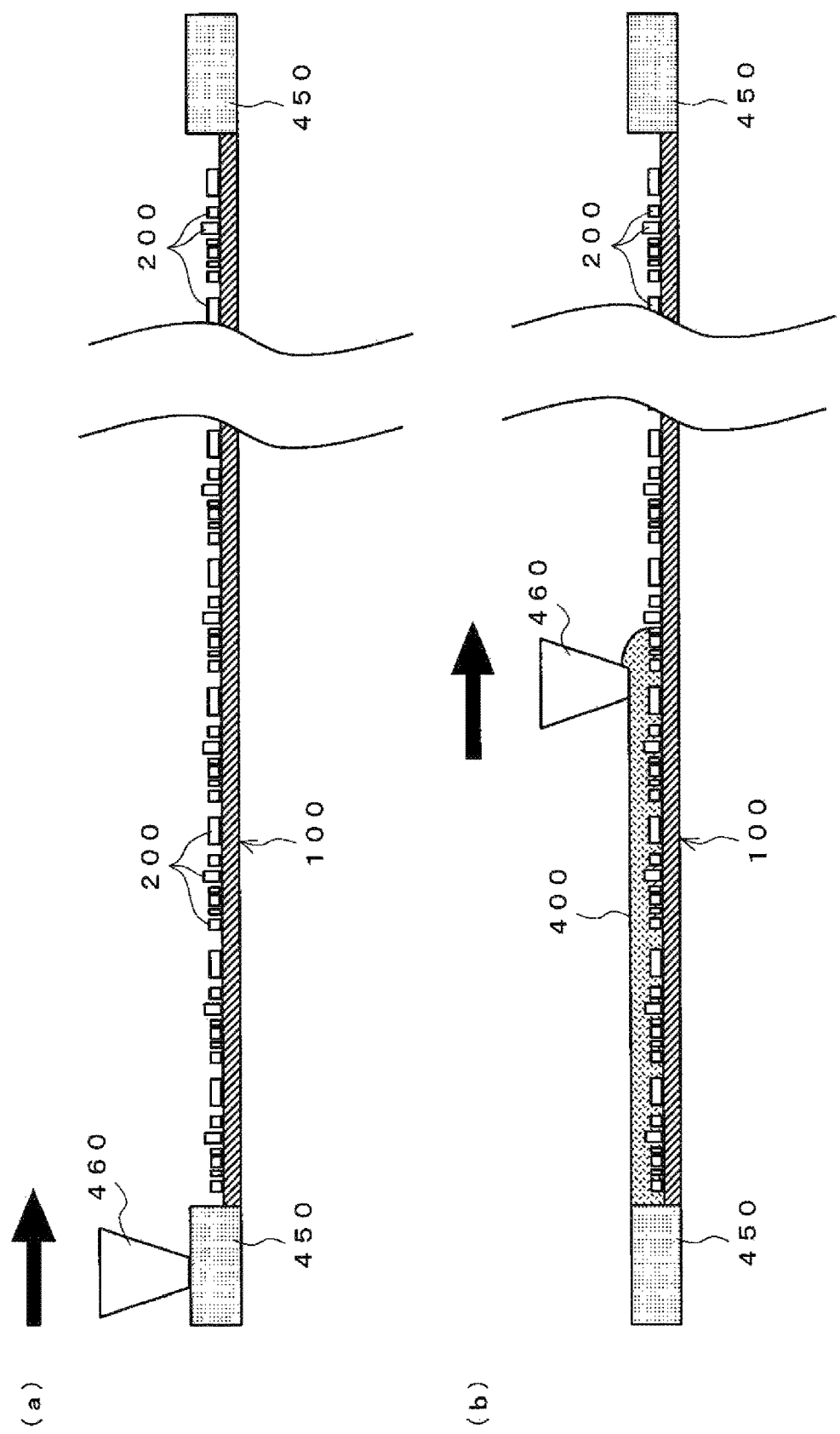
FIG. 3 A side view showing a principle of vacuum printing used in the method of manufacturing encapsulated circuit modules of the embodiment.

The principle of the vacuum printing is described briefly with reference to FIG. 3. In performing the vacuum printing, the substrate 100 is placed between, for example, metal masks 450. Then, a rod-shaped squeegee 460 of which longitudinal direction coincides with a direction perpendicular to the drawing sheet is moved from a position on the one metal mask 450 shown in FIG. 3 (a) toward the other metal mask 450 in the direction depicted by an arrow (b) while supplying an uncured first resin 400. The upper surface of the first resin 400 is leveled by the lower surface of the squeegee 460 and completely covers the entire surface of the substrate 100, flowing between the electronic components 200. Vacuum printing is performed after the substrate 100, the metal masks 450 and the squeegee 460 are all placed in a vacuum chamber (not shown) where a vacuum has been established. Accordingly, no voids can be entrapped in the first resin 400. If the squeegee 460 is moved as shown in FIG. 3, the distance or height of the squeegee 460 from the substrate 100 is usually constant.

In this embodiment, the thickness of the first resin 400, in other words, the height of the first resin from the substrate 100 is such that the roof 310 of the partition member 300 is embedded therein. Specifically, the thickness of the first resin 400 above the roof 310 is about 100 μm or larger.

The first resin 400 covering the substrate 100 is cured by leaving it stand for an appropriate period of time.

Note that the roof 310 of the side walls 320 of the partition member may have the roof holes 311 formed therethrough and the side walls 320 of the partition member 300 may have side wall holes 321 formed therethrough. The first resin 400 before curing flows into the side walls 320 of the partition member through these holes.

The side wall holes 321 provided in the side walls 320 of the partition member shown in FIG. 2(d) serve to strengthen a connection between the side walls 320 of the partition member and the first resin 400 because the first resin 400 is cured within the side wall holes 321. The roof holes 311 in the roof 310 exhibit a similar function.

The first resin 400 is required to have three properties, i.e., a penetrability (which is a property before being cured) to allow the first resin 400 to enter between the electronic components 200, an adhesion to the electronic components 200 as well as the substrate, and an anti-warping feature (which is a property after being cured).

In order to achieve these properties of the first resin 400, it is preferable that the first resin 400 has the following characteristics. If the first resin 400 has the following characteristics, the aforementioned requirements for the properties of the fist resin before and after curing are both met.

The characteristics of the first resin 400 that are preferably achieved include a content of 80% by weight or more of filler relative to the total weight of the first resin containing the filler before being cured, and a linear expansion coefficient ($\alpha 1$) of 11 ppm/TMA or lower, a linear expansion coefficient ($\alpha 2$) of 25 ppm/TMA or lower, and a modulus of elasticity at 25° C. of 15 GPa/DMA or lower after being cured.

Examples of the first resin 400 having the aforementioned characteristics include a resin compositions (product ID: CV5385 (trade mark)) manufactured and sold by Panasonic Corporation. These resin compositions contain, for example, silica (as filler), an epoxy resin, a curing agent, and a modifier. The resin composition contains one type of resin. Therefore, the major resin component of the first resin 400 in the present application is an epoxy resin.

As described above, the first resin 400 contains filler and the aforementioned resin compositions (product ID: CV5385) contain filler. The amount of the filler contained in these resin compositions is 83% by weight, which satisfies the requirement of 80% by weight or more relative to the first resin 400. The filler is made of a material with a small linear expansion coefficient and is typically made of silica. Furthermore, in order to achieve the penetrability of the first resin 400, the particle diameter of the filler may be 30 μm or smaller. The fillers contained in the two resin compositions exemplified above both satisfy these conditions.

The resin compositions exemplified above have a linear expansion coefficient ($\alpha 1$) of 11 ppm/TMA, a linear expansion coefficient ($\alpha 2$) of 25 ppm/TMA, and a modulus of elasticity at 25° C. of 15 GPa/DMA after being cured, which satisfy the aforementioned preferable conditions.

Figure 1E:
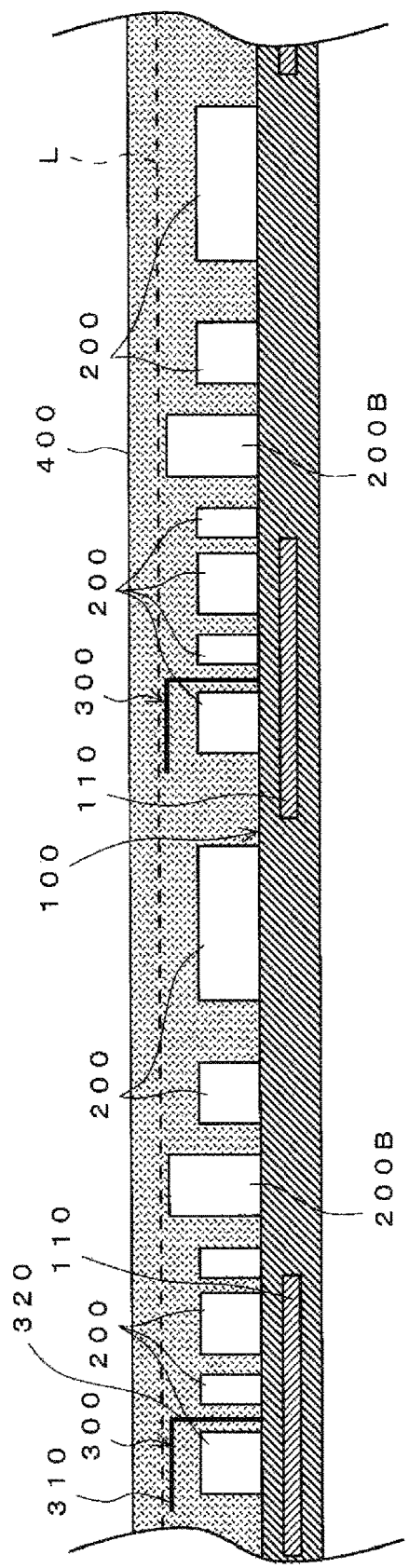
FIG. 1(e) A side cross-sectional view showing a range to be removed from the first resin shown in FIG. 1(d).
Figure 1F:
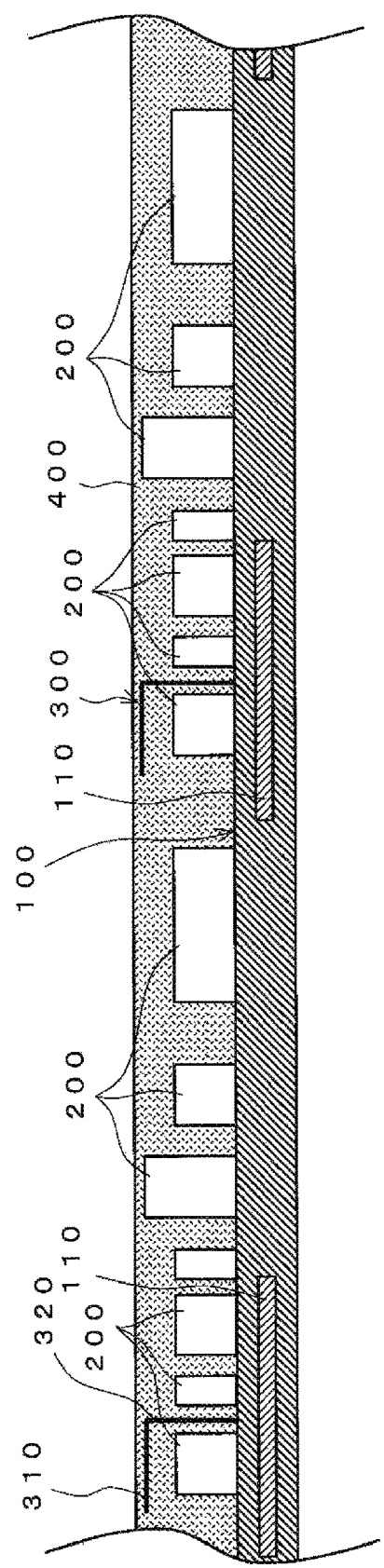
FIG. 1(f) A side cross-sectional view showing a state in which a portion of the first resin shown in FIG. 1(e) that should be removed has been removed.

Then, although not being essential, the upper portion of the first resin 400 is removed. This is mainly for the purpose of reducing the thickness of the first resin 400 on the substrate 100, thereby reducing the thickness of the final encapsulated circuit modules. In this embodiment, a portion of the first resin 400 positioned above a position depicted by a broken line L in FIG. 1(e) is removed. The state in which the portion of the first resin 400 positioned above the broken line L has been removed is shown in FIG. 1(f).

In this embodiment, the upper surface of the first resin 400 after the removal of the portion of the first resin 400 positioned above the broken line L is parallel to the one surface of the substrate 100, but not limited thereto. A distance exists between the upper surface of the roof 310 of the partition member 300 and the upper surface of the first resin 400 after the portion of the first resin 400 positioned above the broken line L, but not limited thereto. The length of the distance in the up and down direction in FIG. 1 is preferably 120 μm or smaller, and more preferably, between 80 μm and 120 μm.

In this embodiment, the distance between the uppermost portion of an electronic component 200B which is the tallest in the electronic components 200 and the upper surface of the first resin 400 after the portion of the first resin 400 positioned above the broken line L has been removed is between 30 μm and 80 μm, but not limited thereto.

The method of removing the portion of the first resin 400 positioned above the broken line L can be any one of known suitable techniques. For example, the first resin 400 can be removed using a cutting machine such as a milling machine or a grinding/cutting machine such as a dicing machine.

Figure 1G:
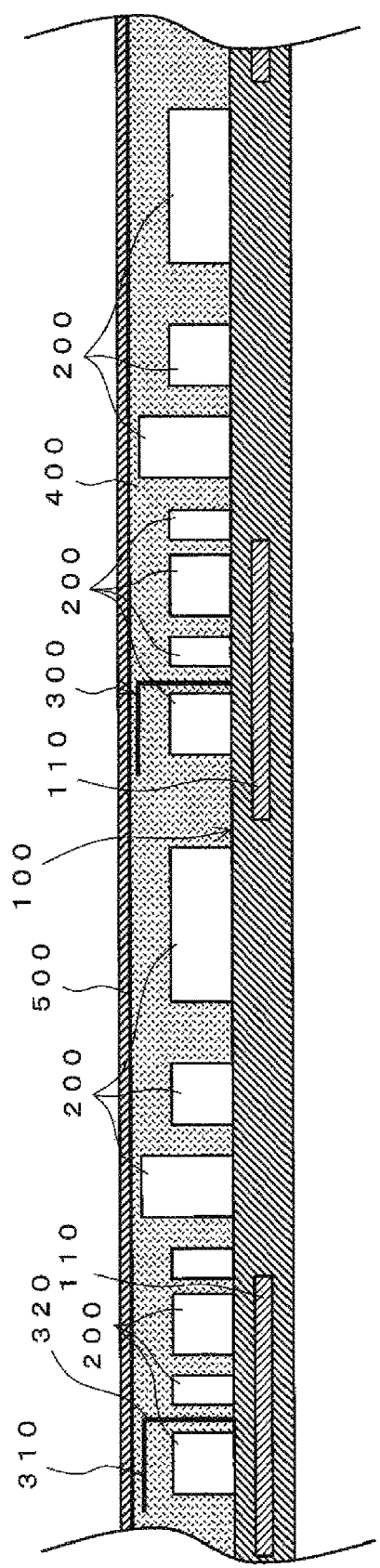
FIG. 1(g) A side cross-sectional view showing a state in which an upper surface of the first resin shown in FIG. 1(f) is covered with a second resin and the second resin is cured.
Figure 1H:
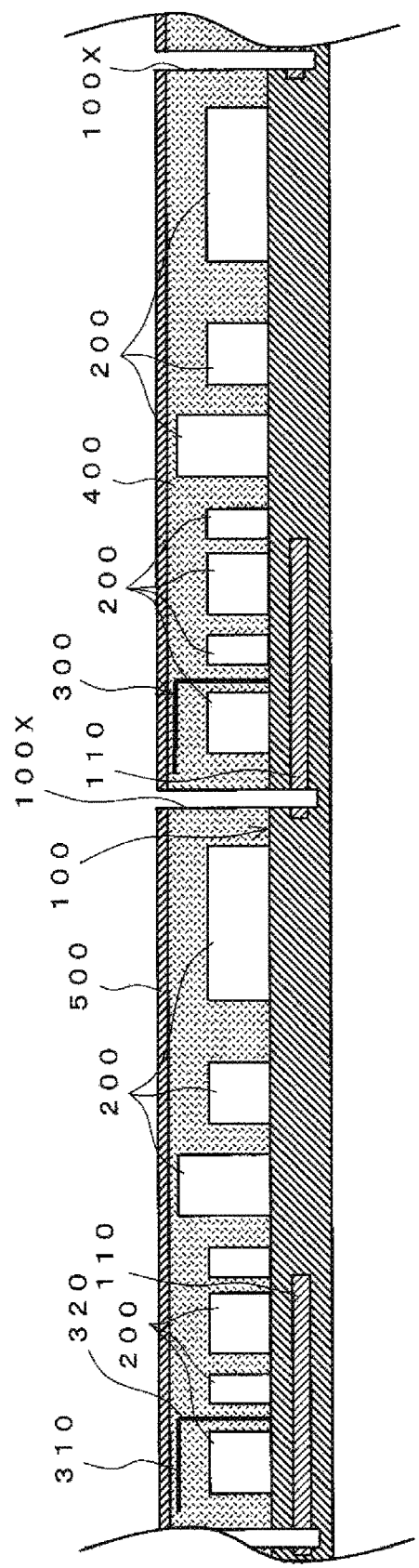
FIG. 1(h) A side cross-sectional view showing a state in which the substrate shown in FIG. 1(g) has been subjected to snicking.
Figure 1I:
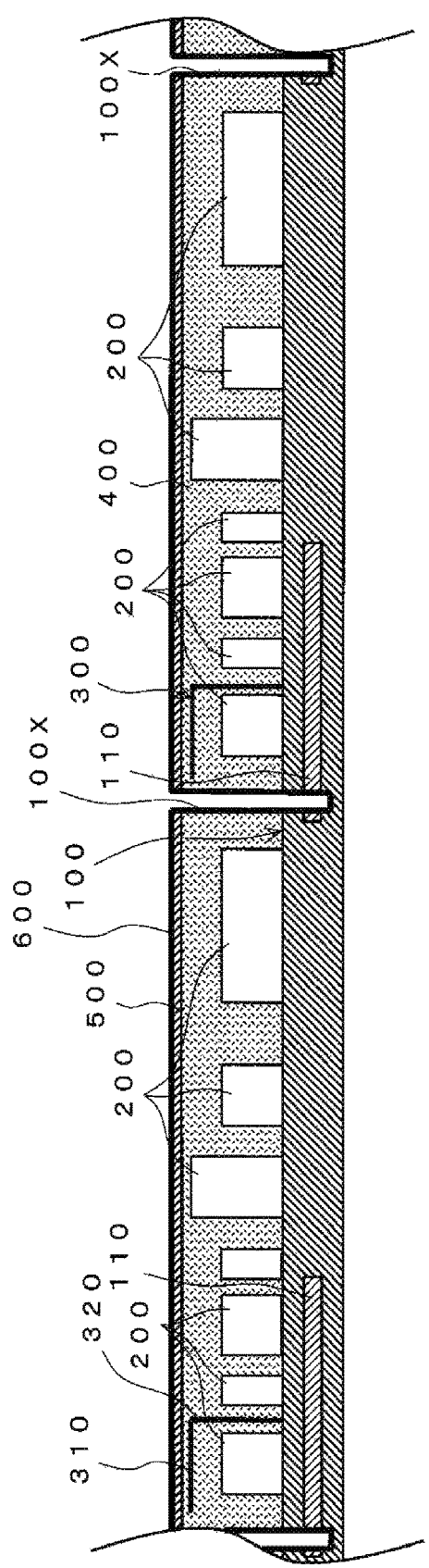
FIG. 1(i) A side cross-sectional view showing a state in which a shield layer is provided to the substrate shown in FIG. 1(h).
Figure 1J:
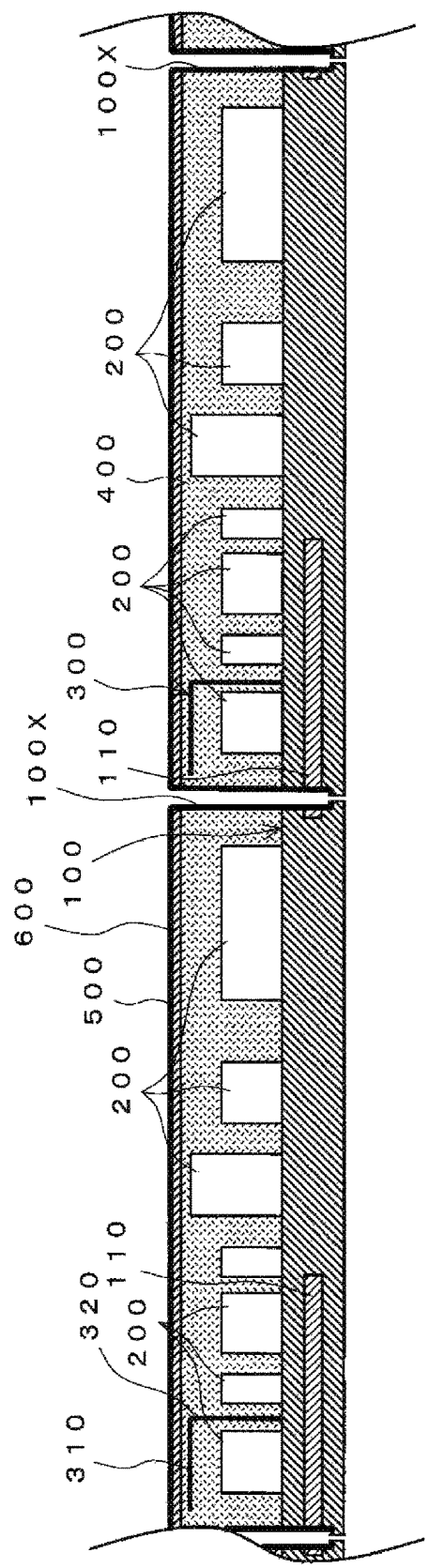
FIG. 1(j) A side cross-sectional view showing a state in which the substrate shown in FIG. 1(i) has been subjected to snipping.

Next, although not necessarily required, the upper surface of the first resin 400 (i.e., the surface facing the substrate 100) which is parallel to the substrate 100 is covered with the second resin 500 and the second resin 500 is cured (FIG. 1(g)). The reason the upper surface of the first resin 400 is covered with the second resin 500 is to prevent the filler contained in the first resin 400 from falling off the first resin 400. At least a portion of the upper surface of the first resin 400 to be covered with the shield layer described later is covered with the second resin 500.

The second resin 500 does not contain filler. The material of the second resin 500 is selected such that the second resin 500 after being cured has high adhesion to the first resin 400. For example, an epoxy resin or an acrylic resin may be used as a material of the second resin 500. To increase the adhesion of the second resin 500 to the first resin 400, it is easy to use, as the second resin 500, a same type of resin as that contained in the first resin 400 as a major resin component. Since the major resin component in the first resin 400 is an epoxy resin as described above, it is possible to use an epoxy resin as the material of the second resin 500 in this embodiment. In this embodiment, the second resin 500 is an epoxy resin but not limited thereto.

It is better to reduce the thickness of the second resin 500 as much as possible to the extent that the following two conditions are satisfied. First, since the second resin 500 contributes to keeping the filler in the first resin 400, it should be thick enough to allow this. Second, the second resin 500 should be thick enough not to interfere a process of surface roughening, which can be made to a surface of the second resin 500 to improve the adhesion of metal-plating to the surface of the second resin, because an excessively thin layer of the second resin 500 can cause a problem of the surface roughening. It is better that the second resin 500 is as thin as possible to the extent that these two conditions are satisfied.

The second resin 500 in this embodiment covers the entire upper surface of the first resin 400, but not limited thereto.

The technique used to cover the upper surface of the first resin 400 with the second resin 500 can be any one of known techniques. For example, the upper surface of the first resin 400 can be covered with the second resin 500 by spray coating using a spraying device.

The second resin 500 covering the first resin 400 is cured by leaving it stand for an appropriate period of time.

Next, the surface of the second resin 500 is roughened. Roughening of the surface of the second resin 500 is for the purpose of allowing a shield layer described later deposited thereon to be adhered better and is thus performed such that this purpose is achieved. Roughening techniques for surfaces of resins are known or widely known such as etching using a strong acid or strong alkali and one of these techniques can be used to roughen the surface of the second resin.

Subsequently, the substrate 100 is subjected to snicking (FIG. 1(*h*)). This snicking is a process of forming a groove-like cut 100X through the second resin 500, through the first resin 400 and in the substrate 100.

The range where the cut 100X is formed is a range with a predetermined width across the boundary between the adjacent sections 120. The depth of the cut 100X is determined such that the cut reaches the ground electrode 110 in the substrate in this embodiment, but not limited thereto. As a result, the edge of the ground electrode 110 is exposed on the periphery of each section 120 after the snicking step. The width of the cut 100X is, for example, between 200 μm and 400 μm but not limited thereto. The width of the cut 100X is determined according to the properties of the first resin and the width of a blade of the dicing machine used for snicking.

The snicking step can be done using a known technique. For example, snicking can be done using a fully automatic dicing saw DFD641 (trade mark) manufactured and sold by DISCO Corporation equipped with a blade having an appropriate width.

When snicking is performed, a distance exists between the side surface of the first resin 400 exposed thereby and the side walls 320 of the partition member 300. For example, if one of the side walls 320 are parallel to one of the side surfaces of the first resin 400, the distance between them is preferably 120 μm or smaller, and more preferably, between 80 μm and 120 μm. If the side wall 320 is not parallel to the side surface of the first resin 400, the distance between the side surface of the first resin 400 and the edge of the side wall 320 that is closer to the side surface of the first resin 400 is preferably 120 μm or smaller, and more preferably, between 80 μm and 120 μm, regardless of whether they are parallel to each other.

In this embodiment, the snicking is performed at a position and a width with which this condition can be satisfied.

Then, portions of the first resin 400, the second resin 500, and the substrate 100 which are described below are covered with a shield layer 600 (FIG. 1(*i*)).

The shield layer 600 is for protecting, when the final encapsulated circuit module is used, the electronic component(s) 200 in the encapsulated circuit module from the electromagnetic waves emitted by an electronic component or components positioned outside the encapsulated circuit module(s) or for protecting an electronic component or components positioned outside the encapsulated circuit module from the electromagnetic waves emitted by the electronic component(s) 200 in the encapsulated circuit module.

The shielding layer 600 is formed of a conductive metal suitable for shielding electromagnetic waves. The shield layer may be a single layer or it may have two or more layers. If the shield layer 600 is multi-layered, the metal constituting the respective layers may be different.

Figure 4:
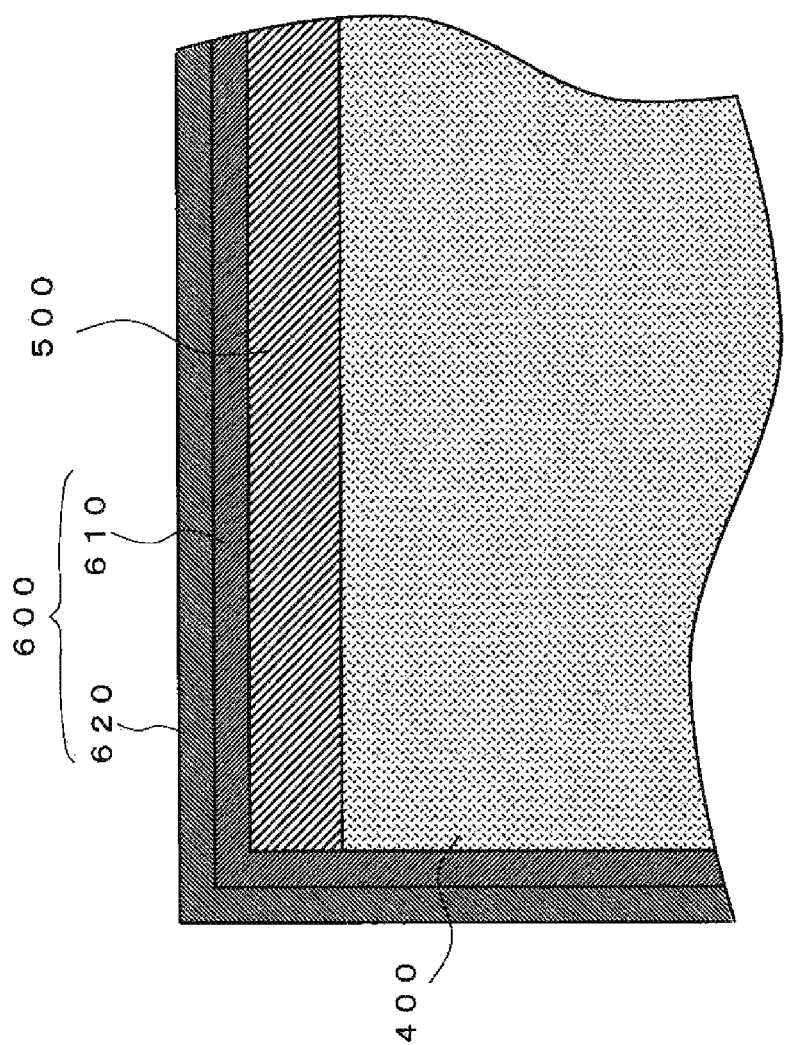
FIG. 4 A side cross-sectional view showing an example of a configuration of a shield layer obtained by the method of manufacturing encapsulated circuit modules of the embodiment.

The shield layer 600 in this embodiment has two layers, but not limited thereto. The shield layer is formed to have a two-layered structure with a first metal covering layer 610 comprising a first metal having an excellent shielding property against an electric field and a second metal covering layer 620 comprising a second metal having an excellent shielding property against a magnetic field (FIG. 4). As the first metal, for example, copper or iron can be used. As the second metal, for example, nickel can be used. In this embodiment, copper and nickel are used as the first and second metals, respectively, but not limited thereto. Either the first metal covering layer 610 or the second metal covering layer 620 may be exposed outside. The second metal covering layer 620 is exposed outside in this embodiment, but not limited thereto. This is for the purpose of avoiding deterioration of the appearance when copper is used as the first metal because it turns black as a result of natural oxidation.

The shield layer 600 is provided on the surface of the second resin 500 as well as the side surfaces of the first resin 400 and the substrate 100 which have been exposed outside by the snicking. The shield layer 600 is electrically connected with the ground electrode 110 in the substrate 100 at the side surface of the substrate 100.

The shield layer 600 can be formed by applying a paste containing metal powder or metal-plating. If the shield layer 600 is a multilayer, the method of forming the individual layers may be the same or not. In this embodiment, the first metal covering layer 610 and the second metal covering layer 620 are formed using a same method.

The metal-plating may be either wet plating or dry plating. Examples of the wet plating include electroless plating. Examples of the dry plating include physical vapor deposition (PVD) and chemical vapor deposition (CVD). Examples of the former include sputtering and vacuum vapor deposition and examples of the latter include thermal CVD and photo CVD.

Of these, in consideration of costs and its capability of reducing residual stress in the shield layer 600, wet plating should be selected. Furthermore, the wet plating can provide a thicker shield layer 600 which specifically ranges from several micrometers to several tens micrometers. It is thus easy to provide a sufficient thickness for shielding electromagnetic waves. Although wet plating includes electrolytic plating and electroless plating, it is preferable to use electroless plating in consideration of possible damages of the electronic components in the encapsulated circuit modules to be processed, because the electroless plating does not require any flow of electrical current through surfaces of the encapsulated circuit modules.

The first metal covering layer 610 and the second metal covering layer 620 in this embodiment are both formed by electroless plating, but not limited thereto.

Finally, the substrate 100 is snipped into separate sections 120 along the cut 100X made by the snicking step (FIG. 1(*j*)).

The snipping step can be done using a known technique. For example, snipping can be done using the aforementioned fully automatic dicing saw DFD641 (trade mark) equipped with a blade having an appropriate width.

As a result, the encapsulated circuit modules corresponding to the sections of the substrate 100 can be obtained.

Figure 5:
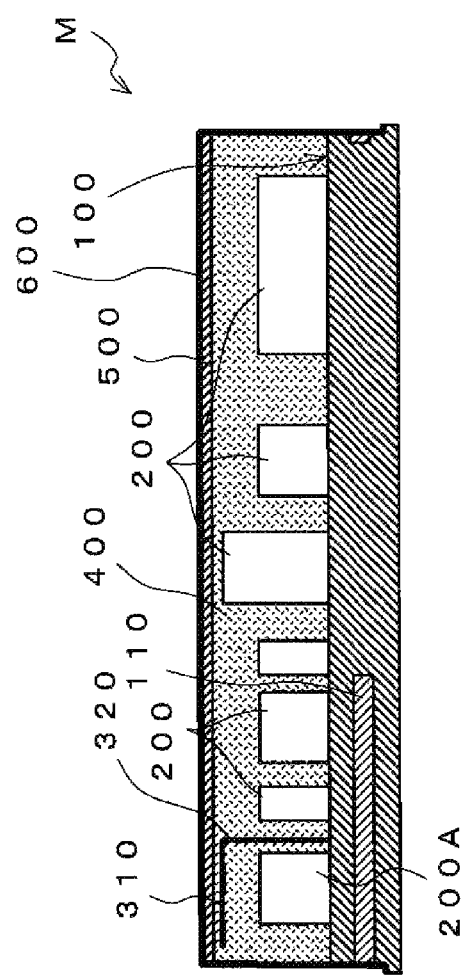
FIG. 5 A side cross-sectional view of an encapsulated circuit module obtained by the method of manufacturing encapsulated circuit modules according to the embodiment.
Figure 6:
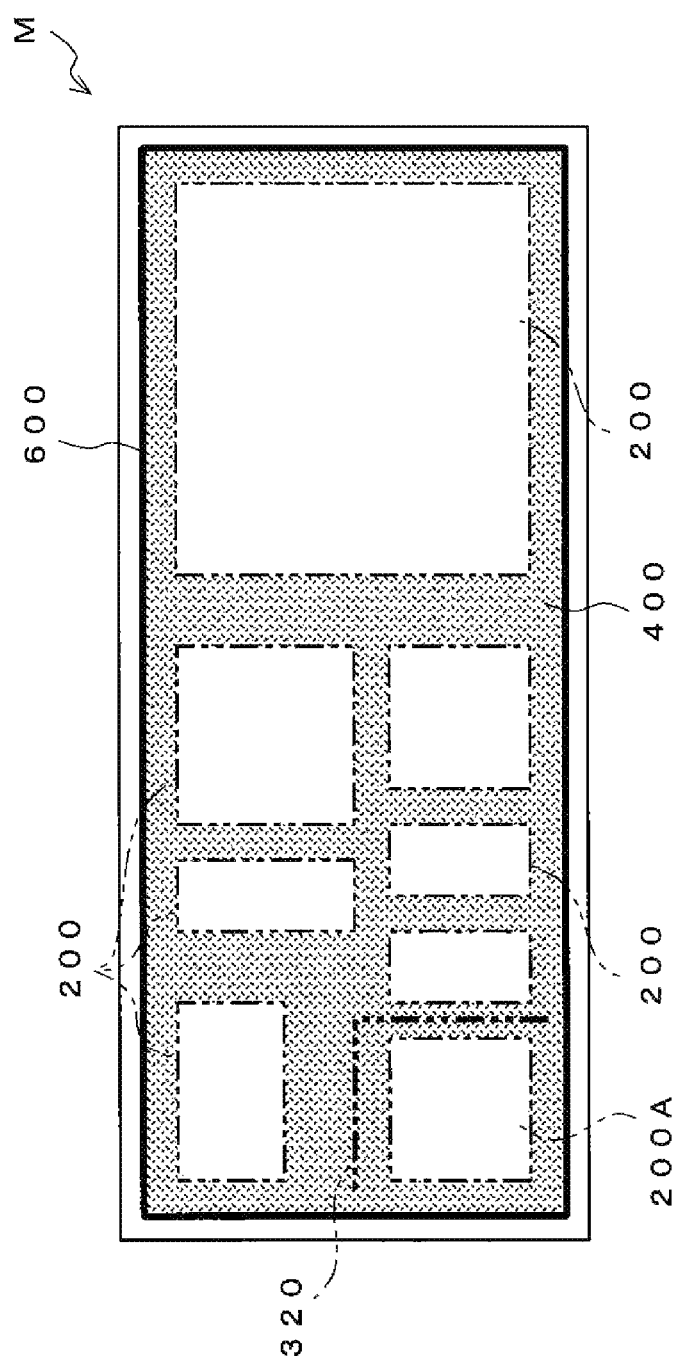
FIG. 6 A transparent plan view of an encapsulated circuit module obtained by the method of manufacturing encapsulated circuit modules according to the embodiment.

A cross-sectional view of an encapsulated circuit module M obtained using the aforementioned method is shown in FIG. 5 and a perspective plan view of the encapsulated circuit module M in shown in FIG. 6.

As shown in FIG. 5, the substrate 100 of the encapsulated circuit module M is covered with the first resin 400 together with the electronic components 200. The upper surface of the first resin 400 is covered with the second resin 500. Furthermore, the upper surface of the second resin 500, the side surfaces of the first resin 400 and the second resin 500, and the side surface of the substrate 100 exposed by the snicking are covered with the shield layer 600. The shield layer 600 includes a first metal covering layer 610 and the second metal covering layer 620 as described above, which are electrically connected with the side surface of the ground electrode 110 in the substrate 100 as shown in FIG. 5. With the second resin 500, the portion of the shield layer 600 that covers the first resin 400 with the second resin 500 being interposed between them does not have a problem of falling off which otherwise can occur due to the falling off of the filler from the first resin 400. Although the portion of the shield layer 600 that covers the side surface of the first resin 400 covers the first resin 400 without the interposed second resin, the shield layer 600 adheres to the first resin 400 well because the side surface of the first resin 400 is rather roughened as a result of the snicking step and thus is not likely to be separated from the side surface of the first resin.

The electronic component 200A is protected by the side walls 320 of the partition member 300 on two sides thereof, by the shield layer 600 on two sides thereof, and by the roof 310 and the shield layer 600 on the upper surface thereof. As a result, the influence of the electromagnetic waves emitted by the electronic component 200A on the electronic component(s) 200 located outside the partition or the influence of the electromagnetic waves emitted by the electronic component(s) 200 located outside the partition on the electronic component 200A can be suppressed. The electronic component 200A shielded from any other components inside the partition is not necessarily a single component. Instead, it may be two or more components.

In addition, the roof 310 of the partition member 300 is parallel to the upper surface of the first resin 400 and a distance exists between them. The distance is preferably 120 μm or smaller, and more preferably, between 80 μm and 120 μm. In this embodiment, the distance is substantially 100 μm.

Of the edges of the side walls 320 of the partition member 300, the left edge of the side wall extending in the horizontal direction in FIG. 6 is parallel to the left side surface of the first resin 400 of the encapsulated circuit module M in FIG. 6 and a distance exists between them. The distance is preferably 120 μm or smaller, and more preferably, between 80 μm and 120 μm. In this embodiment, the distance is substantially 100 μm.

Of the edges of the side walls 320 of the partition member 300, the lower edge of the side wall extending in the vertical direction in FIG. 6 is parallel to the lower side surface of the first resin 400 of the encapsulated circuit module M in FIG. 6 and a distance exists between them. The distance is preferably 120 μm or smaller, and more preferably, between 80 μm and 120 μm. In this embodiment, the distance is substantially 100 μm.

<Modified Version>

An encapsulated circuit module according to the modified version is generally identical to the one described in the above embodiment in terms of structure and method of manufacture.

The only difference lies in a structure of the partition member 300.

Figure 7:
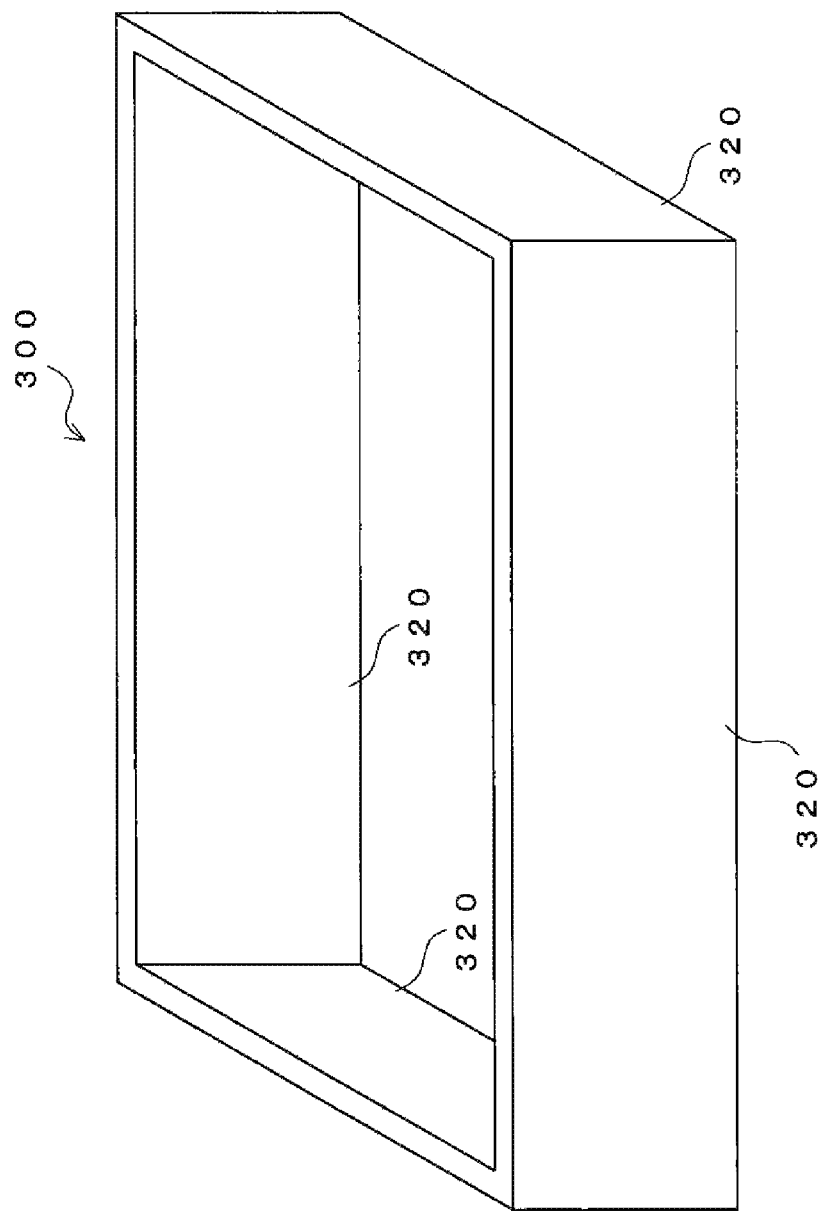
FIG. 7 A perspective view of a partition member used in a method of manufacturing encapsulated circuit modules of a modified version.

The partition member 300 in the modified version is configured as shown in FIG. 7.

The partition member 300 in the modified version has only the side walls 320 and does not have the roof 310 which is included in the partition member 300 of the aforementioned embodiment. The partition member 300 in this embodiment has a plate-like shape, but not limited thereto, and is comprised of four rectangular side walls 320 assembled as a rectangle like a picture frame when seen from the above, but not limited thereto.

In order to manufacture the encapsulated circuit modules in the modified version, the electronic components 200 are attached to one surface of the substrate 100 in the same manner as in the aforementioned embodiment.

Next, as in the case of the aforementioned embodiment, the partition member 300 is attached to the substrate 100. In the case of the modified version, the partition member 300 is attached to the substrate 100 with the electronic component 200A such as a high frequency oscillator which emits strong electromagnetic waves or the electronic component 200A which is required to be protected from electromagnetic waves emitted by other electronic component(s) 200 in the encapsulated circuit module enclosed by the four side walls 320 of the partition member 300. The lower end of the partition member 300 is electrically connected with the ground electrode 110, as in the case of the aforementioned embodiment.

Next, as in the case of the aforementioned embodiment, the surface of the substrate 100 to which the electronic components 200 and the partition member 300, if necessary, are attached is entirely covered with the first resin 400 together with the electronic components 200 and the partition member 300, and the first resin 400 is cured.

Subsequently, although not being essential, the upper portion of the first resin 400 is removed as in the case of the aforementioned embodiment. In this modified version, a distance exists between the upper surface of the first resin 400 after the upper portion of the first resin 400 has been removed and the upper end of the side walls 320 of the partition member 300. The distance is preferably 120 μm or smaller, and more preferably, between 80 μm and 120 μm.

Next, although not necessarily required, the upper surface of the first resin 400 parallel to the substrate 100 is covered with the second resin 500 and the second resin 500 is cured as in the case of the aforementioned embodiment.

Next, as in the case of the aforementioned embodiment, the substrate 100 is subjected to snicking. In the modified version, after the snicking, a distance exists between the side surface of the first resin 400 exposed by the snicking process and the side walls 320 of the partition member 300. The size of this distance will be described later.

Then, the first resin 400, the second resin 500, and the substrate are covered with the shield layer 600 at the position described in the above embodiment in a similar manner to the one described in the above embodiment.

Finally, the substrate 100 is subjected to snipping to divide it into the sections 120 along the cuts 100X formed by the snicking in a similar manner to the one described in the above embodiment.

Figure 8:
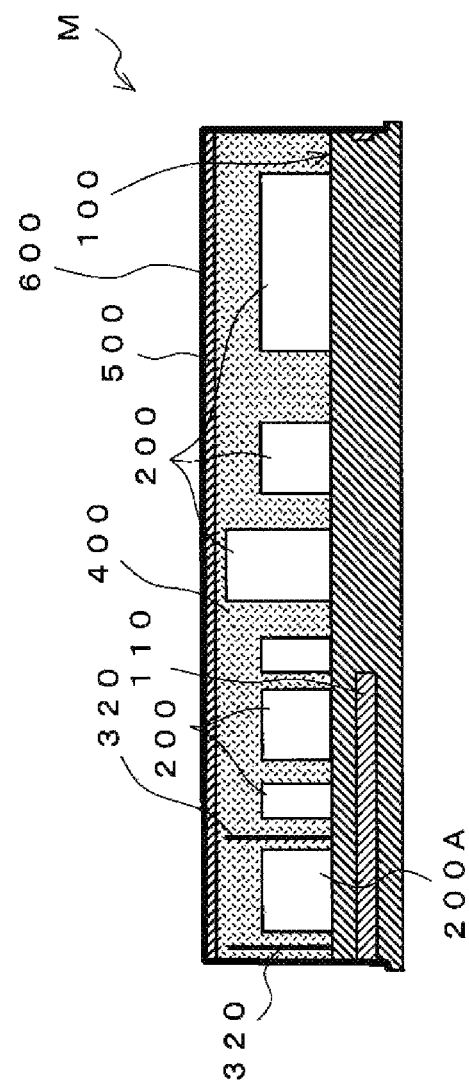
FIG. 8 A side cross-sectional view of an encapsulated circuit module obtained by the method of manufacturing encapsulated circuit modules of a modified version 1.

FIG. 8 shows a cross-sectional view of an encapsulated circuit module M according to the modified version obtained using the method described above, and FIG. 9 shows a perspective plan view of the encapsulated circuit module M.

The encapsulated circuit module M is almost identical to the encapsulated circuit module M in the aforementioned embodiment. The differences lie in the follow points.

First, the electronic component 200A included in the encapsulated circuit module M is surrounded from the four sides by the side walls 320 of the partition member 300 and is covered from above with the shield layer 600. As a result, it is possible to suppress the influence of the electromagnetic waves emitted by the electronic component 200A on the electronic component(s) 200 positioned outside the partition or the influence of the electromagnetic waves emitted by the electronic component(s) 200 positioned outside the partition on the electronic component 200A.

The upper ends of the four side walls 320 of the partition member are parallel to the upper surface of the first resin 400 and a distance exists between them. The distance is preferably 120 µm or smaller, and more preferably, between 80 µm and 120 µm.

Figure 9:
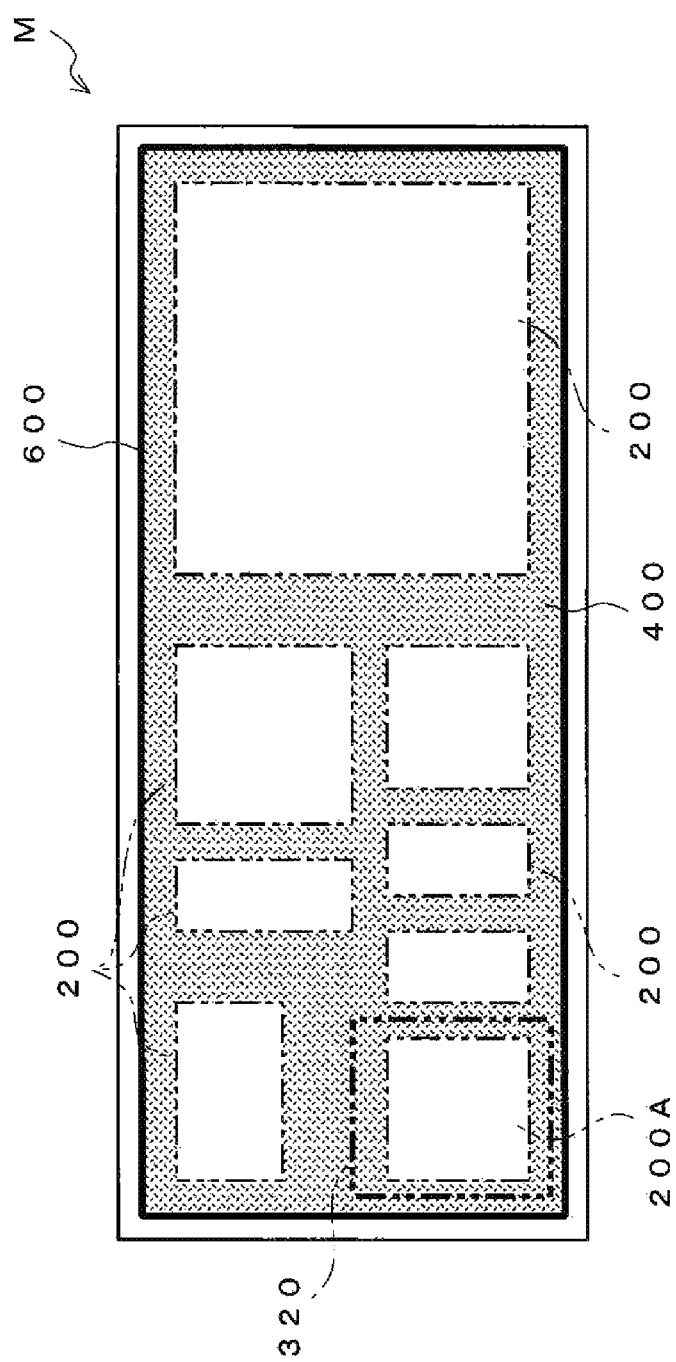
FIG. 9 A perspective plan view of an encapsulated circuit module obtained by the method of manufacturing encapsulated circuit modules of the modified version 1.

Of the edges of the side walls 320 of the partition member 300, the edges of the left and lower side walls in FIG. 9 are parallel to the left and lower side surfaces of the first resin 400 of the encapsulated circuit module M in FIG. 9, and distances exist between them. Each of the distances is preferably 120 µm or smaller, and more preferably, between 80 µm and 120 µm.

REFERENCE SIGNS LIST 100 substrate
100X cut
110 ground electrode
120 section
200 electronic component
300 partition member
310 roof
320 side wall
400 first resin
500 second resin
600 shield layer

The invention claimed is:

1. An encapsulated circuit module comprising:
a substrate having a ground electrode;
at least two electronic components mounted on a surface of the substrate, at least one of the electronic components being a certain electronic component that should be shielded from electromagnetic waves from the other electronic component(s);
a first resin layer comprising a first resin, the first resin layer covering the surface of the substrate together with the electronic components;
a shield layer formed by covering a surface of the first resin layer, a side surface of the first resin layer, and a side surface of the substrate, the shield layer having a film-like shape and being electrically connected with the ground electrode; and
a partition member having a wall positioned between the certain electronic component and the other electronic component(s) and shielding electromagnetic waves, the partition member having a roof connected with an upper end of the wall, the wall and the roof having a plate-like shape, the roof being substantially parallel to the substrate, a distance existing between the roof and the surface of the first resin layer,
wherein the roof is parallel to the shield layer positioned above the roof, and
wherein a distance between the upper end of the wall and the surface of the first resin layer and a distance between the roof and the shield layer positioned above the roof are each between 80 µm and 120 µm, both inclusive.

2. The encapsulated circuit module according to claim 1, wherein a distance exists between a side edge of the wall and the side surface of the first resin layer.

3. The encapsulated circuit module according to claim 1, wherein the certain electronic component is an oscillator.

4. The encapsulated circuit module according to claim 1, wherein the wall has a hole for strengthening a connection between the wall and the first resin layer present on both sides of the wall.

5. The encapsulated circuit module according to claim 1, wherein the partition member is electrically connected with the ground electrode.

6. The encapsulated circuit module according to claim 1, wherein the partition member is electrically connected with the ground electrode by making a lower end of the wall of the partition member directly into contact with the ground electrode.

7. The encapsulated circuit module according to claim 1, wherein the roof has a hole for strengthening a connection between the roof and the first resin layer present on upper and lower sides of the roof.

8. The encapsulated circuit module according to claim 1, wherein the partition member is made of metal.

9. The encapsulated circuit module according to claim 1, wherein the partition member is made of a metal plate.

10. The encapsulated circuit module according to claim 1, wherein the roof is triangular when viewed from above.

* * * * *

UNITED STATES PATENT AND TRADEMARK OFFICE
CERTIFICATE OF CORRECTION

PATENT NO. : 10,271,432 B2
APPLICATION NO. : 15/534401
DATED : April 23, 2019
INVENTOR(S) : Satoru Miwa It is certified that error appears in the above-identified patent and that said Letters Patent is hereby corrected as shown below:

On the Title Page

At item (73) listing the Assignee, replace "MEEKO ELECTRONICS CO., LTD." with --MEIKO ELECTRONICS CO., LTD.--.

In the Specification

In the Description, at Column 4, Line 64, replace "120 82 m" with --120 μm--.

Signed and Sealed this
Second Day of July, 2019

Andrei Iancu
*Director of the United States Patent and Trademark Office*